United States Patent
Kim et al.

(10) Patent No.: US 12,284,888 B2
(45) Date of Patent: Apr. 22, 2025

(54) DISPLAY PANEL AND DISPLAY DEVICE COMPRISING SAME

(71) Applicant: Samsung Display Co., LTD., Yongin-si (KR)

(72) Inventors: Sun Ho Kim, Seongnam-si (KR); Ju Chan Park, Seoul (KR); Sun Hee Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 554 days.

(21) Appl. No.: 17/595,934

(22) PCT Filed: Jan. 16, 2020

(86) PCT No.: PCT/KR2020/000770
§ 371 (c)(1),
(2) Date: Nov. 29, 2021

(87) PCT Pub. No.: WO2020/242004
PCT Pub. Date: Dec. 3, 2020

(65) Prior Publication Data
US 2022/0320250 A1    Oct. 6, 2022

(30) Foreign Application Priority Data

May 30, 2019  (KR) .................. 10-2019-0063688

(51) Int. Cl.
*H10K 59/131*     (2023.01)
*H10K 50/844*     (2023.01)
(Continued)

(52) U.S. Cl.
CPC ......... *H10K 59/131* (2023.02); *H10K 50/844* (2023.02); *H10K 77/111* (2023.02); *H10K 2102/311* (2023.02)

(58) Field of Classification Search
CPC ............. H10K 59/131; H10K 50/8445; H10K 59/8731; H10K 77/111; H10K 2102/311; H10K 50/844; H10K 59/87; H10K 50/84
See application file for complete search history.

(56) References Cited

U.S. PATENT DOCUMENTS 11,532,681 B2    12/2022  Yang et al.
2015/0138041 A1   5/2015  Hirakata et al.
(Continued)

FOREIGN PATENT DOCUMENTS

CN      109638049 A       4/2019
EP      3 401 896 A1     11/2018
(Continued)

OTHER PUBLICATIONS

International Search Report of PCT/KR2020/000770, Apr. 29, 2020, 6 pages.
(Continued)

*Primary Examiner* — Moazzam Hossain
(74) *Attorney, Agent, or Firm* — Womble Bond Dickinson (US) LLP

(57) ABSTRACT

Provided are a display panel and a display device comprising the same. The display panel includes a substrate including a planar portion, a first edge portion extending from one side of the planar portion, a second edge portion extending from the other side of the planar portion, a first side surface portion extending from one side of the first edge portion, and a first corner portion disposed between the first edge portion and the second edge portion; first data lines disposed in a display area of the planar portion; second data lines disposed in a display area of the first side surface portion; first fan-out lines disposed in a non-display area of the planar portion and connected to the first data lines; second fan-out lines disposed in the first corner portion and connected to the second (Continued)

data lines; and an encapsulation film covering the first data lines, the second data lines, and the first fan-out lines.

12 Claims, 21 Drawing Sheets

(51) Int. Cl.
    *H10K 77/10*     (2023.01)
    *H10K 102/00*     (2023.01)

(56) References Cited

U.S. PATENT DOCUMENTS

| | | | |
|---|---|---|---|
| 2015/0144921 A1 | 5/2015 | Lim et al. | |
| 2018/0322826 A1 | 11/2018 | Lee et al. | |
| 2019/0088733 A1 | 3/2019 | Cho et al. | |
| 2019/0103455 A1 | 4/2019 | Song et al. | |
| 2019/0108793 A1* | 4/2019 | Kim | G09G 3/3233 |
| 2019/0146548 A1 | 5/2019 | Li et al. | |
| 2021/0398955 A1* | 12/2021 | Liu | G09G 3/3648 |

FOREIGN PATENT DOCUMENTS

| | | |
|---|---|---|
| EP | 3457437 A1 | 3/2019 |
| EP | 3462499 A2 | 4/2019 |
| JP | 2015-118373 A | 6/2015 |
| JP | 2018-5222 A | 1/2018 |
| JP | 2019-12229 A | 1/2019 |
| JP | 2019-78976 A | 5/2019 |
| KR | 2016-0082252 A | 7/2016 |
| KR | 10-2018-0036898 A | 4/2018 |
| KR | 2018-0123604 A | 11/2018 |
| KR | 2019-0038718 A | 4/2019 |
| KR | 2019-0041046 A | 4/2019 |
| KR | 10-2020-0042029 A | 4/2020 |

OTHER PUBLICATIONS

Extended European Search Report issued in corresponding application No. EP20812610.2, dated Sep. 20, 2023, 22 pages.
Partial Supplementary European Search Report issued in corresponding application No. EP 20812610.2, dated Jun. 7, 2023, 20 pages.

* cited by examiner

DISPLAY PANEL AND DISPLAY DEVICE COMPRISING SAME

CROSS-REFERENCE TO RELATED APPLICATIONS

This application is a U.S. National Phase Patent Application of International Patent Application Number PCT/KR2020/000770, filed on Jan. 16, 2020, which claims priority to Korean Patent Application Number 10-2019-0063688, filed on May 30, 2019, the contents of which are incorporated herein by reference in their entirety.

TECHNICAL FIELD

The present disclosure relates to a display panel and a display device comprising the same.

BACKGROUND ART

As the information society develops, the demand for display devices for displaying images has increased and diversified. For example, display devices have been applied to various electronic devices such as smartphones, digital cameras, laptop computers, navigation devices, and smart televisions.

The display device may be a flat panel display device such as a liquid crystal display device, a field emission display device, or an organic light emitting display device. The organic light emitting display device has advantages such as a wide viewing angle, an excellent contrast ratio, and a fast response speed. In addition, the organic light emitting display device may be implemented as a flexible display device that may be bent or curved, and thus, the utilization of the organic light emitting display device in electronic devices has gradually increased. For example, a display device that displays an image not only on a front surface but also on a side surface by implementing the organic light emitting display device as the flexible display device has been recently developed.

DISCLOSURE

Technical Problem

Aspects of the present disclosure provide a display panel capable of reducing (e.g., minimizing) a dead space on a front surface when an image is displayed not only on the front surface but also on a side surface.

Aspects of the present disclosure also provide a display device capable of minimizing a dead space on a front surface when an image is displayed not only on the front surface but also on a side surface.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

Technical Solution

Detailed contents of other embodiments are described in a detailed description and are illustrated in the drawings.

Advantageous Effects

With the display panel according to embodiments and the display device comprising the same, the first scan driver, the second fan-out lines, and sixth fan-out lines that do not need to be covered by the encapsulation film are disposed in the first corner portion. Therefore, even though a strain is applied to the first corner portion due to a force with which the first edge portion and the first side surface portion are bent and a force with which the second edge portion and the second side surface portion are bent, the encapsulation film may not be affected by the strain of the first corner portion. Accordingly, occurrence of cracks in the encapsulation film due to the strain of the first corner portion may be prevented or reduced.

With the display panel according to embodiments and the display device comprising the same, at the first corner portion, the organic film pattern is disposed in a hole penetrating through a plurality of inorganic films to expose the substrate. Accordingly, occurrence of cracks in the inorganic films due to the strain of the first corner portion may be reduced.

The aspects of the present disclosure are not limited to the aforementioned aspects, and various other aspects are included in the present specification.

MODE FOR INVENTION

Figure 1:
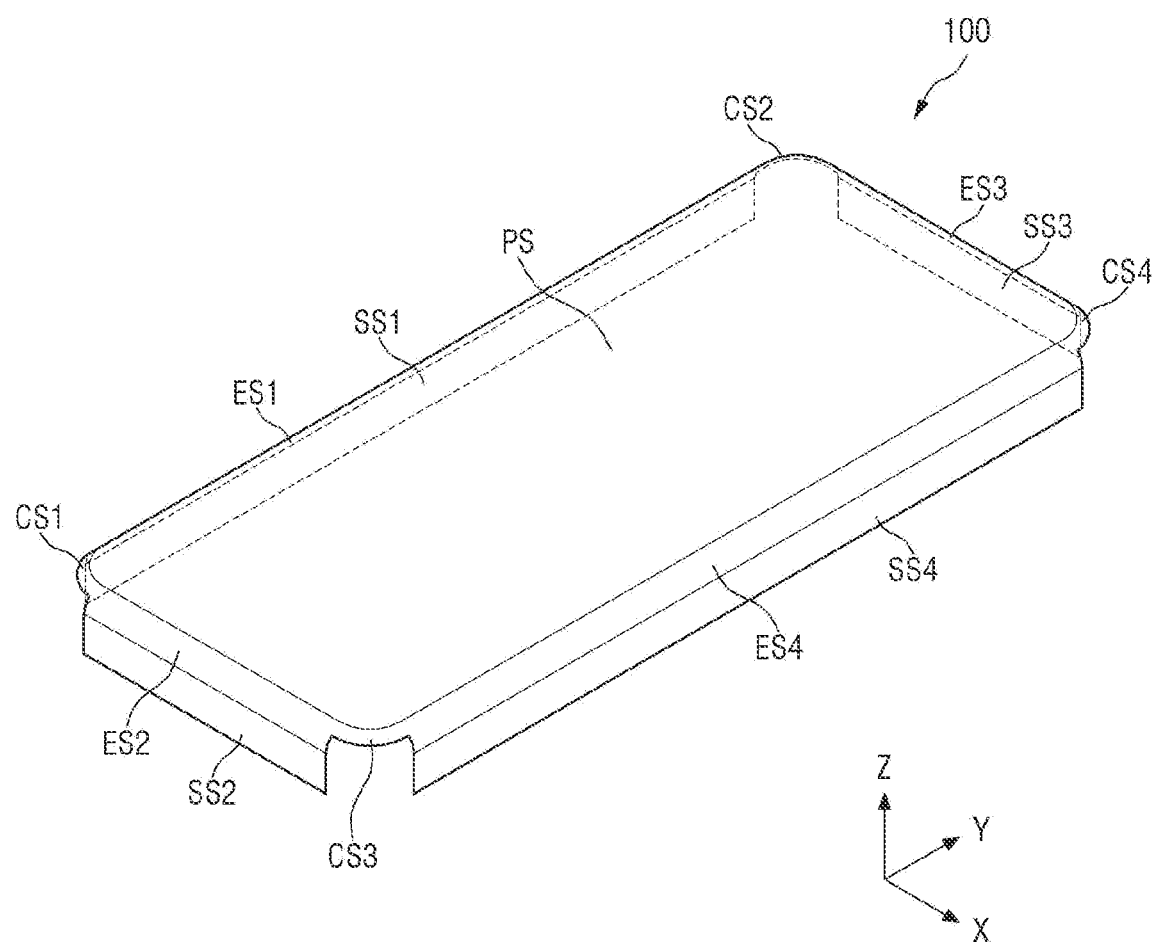
FIG. 1 is a perspective view illustrating a display panel according to an embodiment.

Aspects of the present disclosure and methods for accomplishing them will become apparent from the following detailed description of embodiments with reference to the accompanying drawings. However, the present disclosure is not limited to embodiments to be described below, but may be implemented in various different forms, these embodiments will be provided only in order to make the present disclosure complete and allow one of ordinary skill in the art to which the present disclosure pertains to completely recognize the scope of the present disclosure, and the present disclosure will be defined by the scope of the claims.

A phrase "one element or layer 'on' another element or layer" includes both of a case where one element or layer is directly on another element or layer and a case where one element or layer is on another element or layer with the other layer or element interposed therebetween. Throughout the specification, the same components will be denoted by the same reference numerals. Shapes, sizes, proportions, angles, numbers, and the like, disclosed in the drawings for describing embodiments are examples, and thus, the present disclosure is not limited to those illustrated in the drawings.

The terms "first", "second", and the like are used to describe various components, but these components are not limited by these terms. These terms are used only in order to distinguish one component from another component. Therefore, a first component mentioned below may be a second component within the technical spirit of the present disclosure.

Aspects of each of various embodiments of the present disclosure may be partially or entirely combined with each other and may technically variously interwork with each other, and respective embodiments may be implemented independently of each other or may be implemented together in association with each other.

Hereinafter, various embodiments will be described with reference to the accompanying drawings.

Figure 2A:
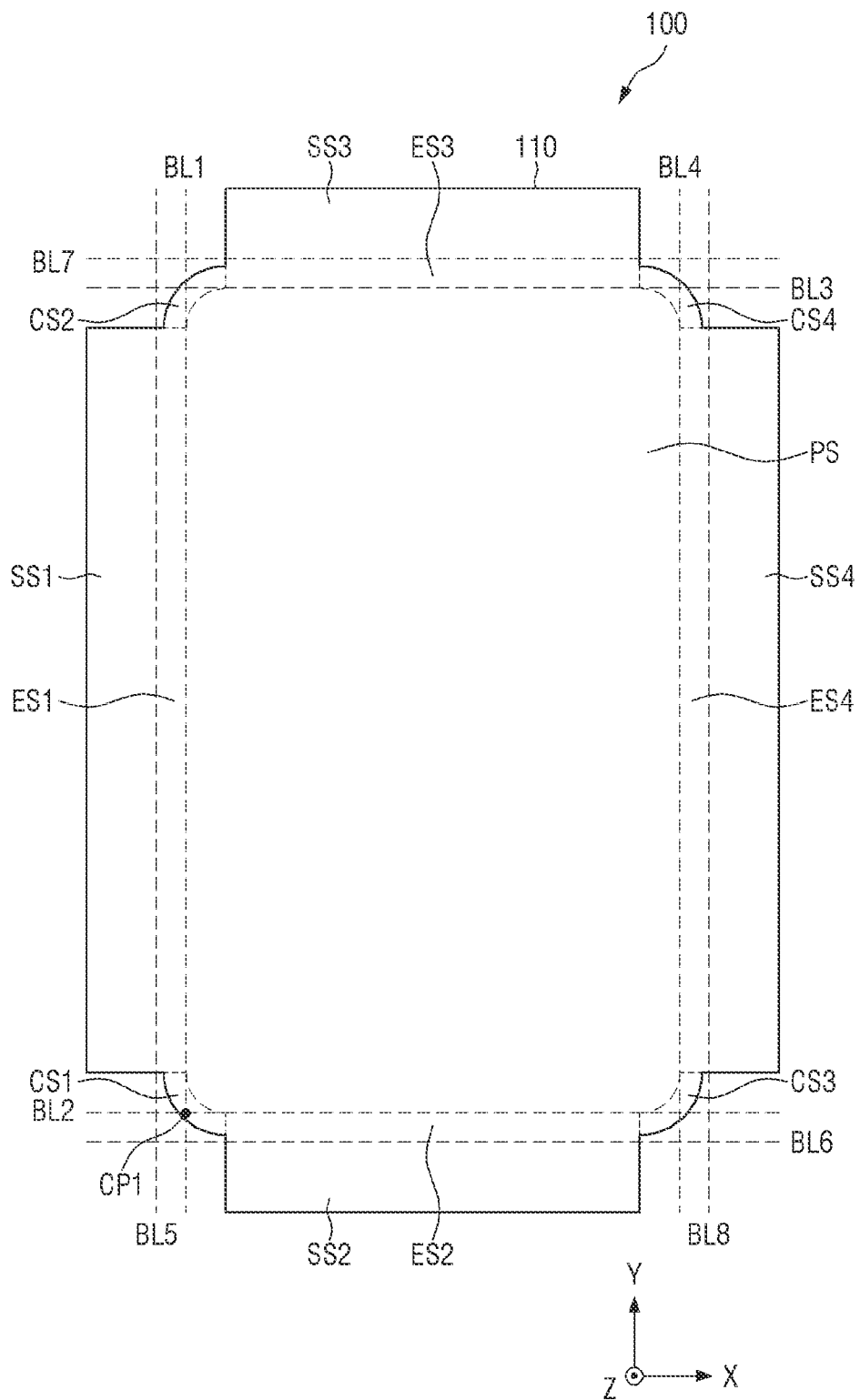
FIGS. 2a and 2b are, respectively, a development view and a plan view of the display panel of FIG. 1.
Figure 2B:
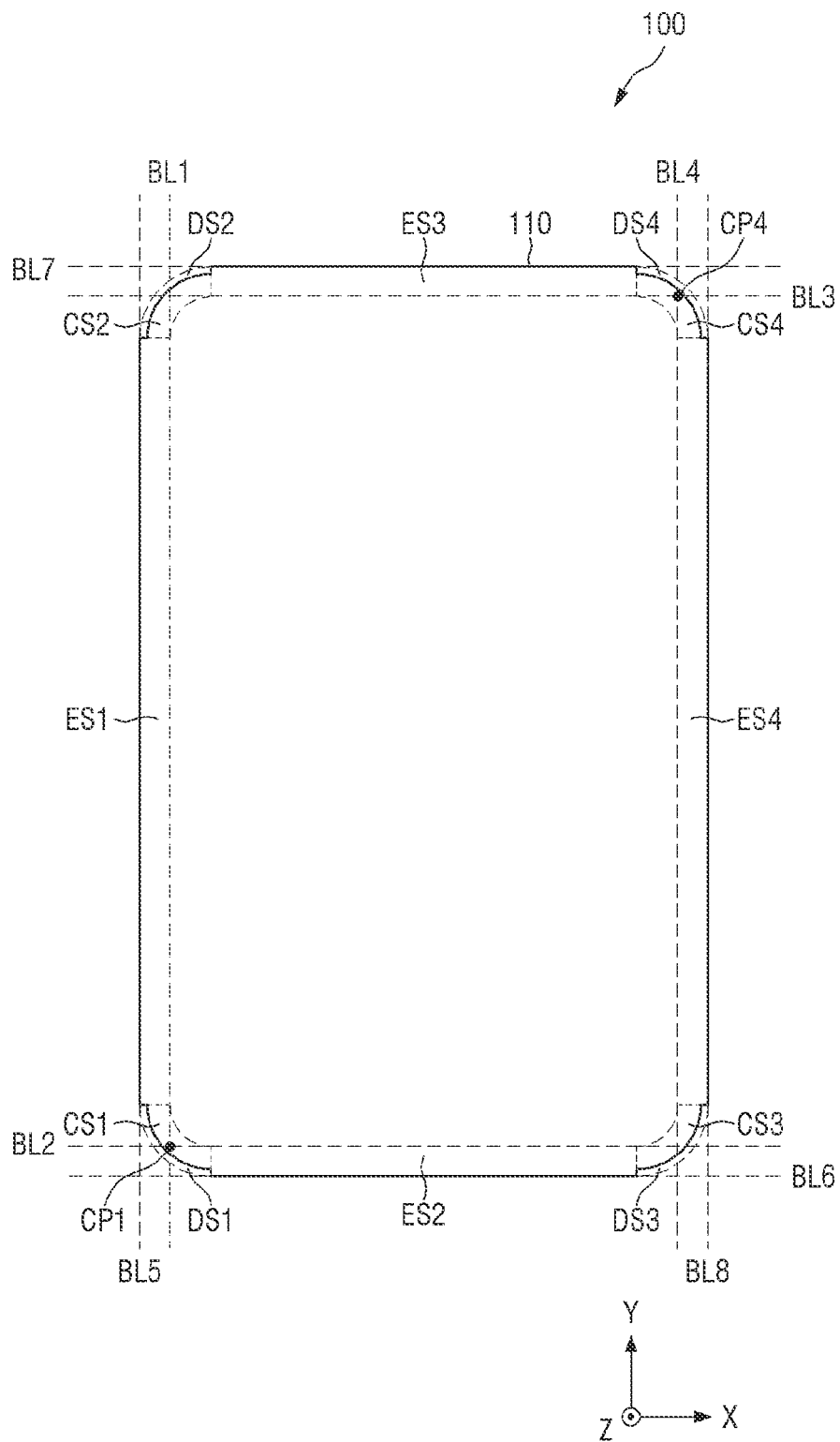

FIG. 1 is a perspective view illustrating a display panel according to some embodiments. FIGS. 2a and 2b are, respectively, a development view and a plan view of the display panel of FIG. 1.

In the present disclosure, the term "above" refers to a Z-axis direction, and the term "below" refers to a direction opposite to the Z-axis direction. In addition, "left", "right", "upper", and "lower" refer to directions when a display panel 100 is viewed in plan view. For example, "left" refers to a direction opposite to an X-axis direction, "right" refers to the X-axis direction, "upper" refers to a Y-axis direction, and "lower" refers to a direction opposite to the Y-axis direction.

Referring to FIGS. 1, 2a, and 2b, a display panel 100 may include a substrate 110 having a planar portion PS, a first side surface portion SS1, a second side surface portion SS2, a third side surface portion SS3, a fourth side surface portion SS4, a first edge portion ES1, a second edge portion ES2, a third edge portion ES3, a fourth edge portion ES4, a first corner portion CS1, a second corner portion CS2, a third corner portion CS3, and a fourth corner portion CS4.

The substrate 110 is a flexible substrate that may be bent, folded, and rolled, and may be formed of plastic. For example, the substrate 110 may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or combinations thereof. Alternatively, the substrate 110 may include a metal material.

The planar portion PS may be a surface formed to be flat without being bent. The planar portion PS may be a rectangular surface having short sides in a first direction (X-axis direction) and long sides in a second direction (Y-axis direction). Corners where the short sides and the long sides meet each other in the planar portion PS may be formed to have a curvature (e.g., predetermined curvature) and may be bent. The planar portion PS may be an upper surface of the display panel 100.

The first edge portion ES1 may extend from a first side of the planar portion PS. The first edge portion ES1 may extend from a left side of the planar portion PS. The first edge portion ES1 may be disposed between the planar portion PS and the first side surface portion SS1. The first edge portion ES1 may be a surface bent at a curvature (e.g., predetermined curvature) in a first bending line BL1 and a fifth bending line BL5. The first bending line BL1 may be a boundary between the planar portion PS and the first edge portion ES1, and the fifth bending line BL5 may be a boundary between the first side surface portion SS1 and the first edge portion ES1.

The first side surface portion SS1 may extend from a first side of the first edge portion ES1. The first side surface portion SS1 may be a left surface of the display panel 100. The first side surface portion SS1 may be a rectangular surface having short sides in a third direction (Z-axis direction) and long sides in the second direction (Y-axis direction).

The second edge portion ES2 may extend from a second side of the planar portion PS. The second edge portion ES2 may extend from a lower side of the planar portion PS. The second edge portion ES2 may be disposed between the planar portion PS and the second side surface portion SS2. The second edge portion ES2 may be a surface bent at a curvature (e.g., predetermined curvature) in a second bending line BL2 and a sixth bending line BL6. The second bending line BL2 may be a boundary between the planar portion PS and the second edge portion ES2, and the sixth bending line BL6 may be a boundary between the second side surface portion SS2 and the second edge portion ES2.

The second side surface portion SS2 may extend from a first side of the second edge portion ES2. The second side surface portion SS2 may be a lower surface of the display panel 100. The second side surface portion SS2 may be a rectangular surface having short sides in the third direction (Z-axis direction) and long sides in the first direction (X-axis direction).

The third edge portion ES3 may extend from a third side of the planar portion PS. The third edge portion ES3 may extend from an upper side of the planar portion PS. The third edge portion ES3 may be disposed between the planar portion PS and the third side surface portion SS3. The third edge portion ES3 may be a surface bent at a curvature (e.g., predetermined curvature) in a third bending line BL3 and a seventh bending line BL7. The third bending line BL3 may be a boundary between the planar portion PS and the third edge portion ES3, and the seventh bending line BL7 may be a boundary between the third side surface portion SS3 and the third edge portion ES3.

The third side surface portion SS3 may extend from a first side of the third edge portion ES3. The third side surface portion SS3 may be an upper surface of the display panel 100. The third side surface portion SS3 may be a rectangular surface having short sides in the third direction (Z-axis direction) and long sides in the first direction (X-axis direction).

The fourth edge portion ES4 may extend from a fourth side of the planar portion PS. The fourth edge portion ES4 may extend from a right side of the planar portion PS. The fourth edge portion ES2 may be disposed between the planar portion PS and the fourth side surface portion SS4. The fourth edge portion ES4 may be a surface bent at a curvature (e.g., predetermined curvature) in a fourth bending line BL4 and an eighth bending line BL8. The fourth bending line BL4 may be a boundary between the planar portion PS and the fourth edge portion ES4, and the eighth bending line BL8 may be a boundary between the fourth side surface portion SS4 and the fourth edge portion ES4.

The fourth side surface portion SS4 may extend from a first side of the fourth edge portion ES4. The fourth side surface portion SS4 may be a right surface of the display panel 100. The fourth side surface portion SS4 may be a rectangular surface having short sides in the third direction (Z-axis direction) and long sides in the second direction (Y-axis direction).

The first corner portion CS1 may be disposed between the first edge portion ES1 and the second edge portion ES2. The first corner portion CS1 is not disposed between the first side surface portion SS1 and the second side surface portion SS2, and an empty space may thus be provided between the first side surface portion SS1 and the second side surface portion SS2. A width of the first corner portion CS1 may be smaller than a width of the first edge portion ES1 and a width of the second edge portion ES2. For this reason, a first dead space DS1 may be disposed outside the first corner portion CS1 in plan view as illustrated in FIG. 2b. The first dead space DS1 may be defined as an empty space in which the first corner portion CS1 is not disposed in a first corner area connecting the first edge portion ES1 and the second edge portion ES2 to each other.

The second corner portion CS2 may be disposed between the first edge portion ES1 and the third edge portion ES3. The second corner portion CS2 is not disposed between the first side surface portion SS1 and the third side surface portion SS3, and an empty space thus may be provided between the first side surface portion SS1 and the third side surface portion SS3. A width of the second corner portion CS2 may be smaller than a width of the first edge portion ES1 and a width of the third edge portion ES3. For this reason, a second dead space DS2 may be disposed outside the second corner portion CS2 in plan view as illustrated in FIG. 2b. The second dead space DS2 may be defined as an empty space in which the second corner portion CS2 is not disposed in a second corner area connecting the first edge portion ES1 and the third edge portion ES3 to each other.

The third corner portion CS3 may be disposed between the second edge portion ES2 and the fourth edge portion ES4. The third corner portion CS3 is not disposed between the second side surface portion SS2 and the fourth side surface portion SS4, and an empty space may thus be provided between the second side surface portion SS2 and the fourth side surface portion SS4. A width of the third corner portion CS3 may be smaller than a width of the second edge portion ES2 and a width of the fourth edge portion ES4. For this reason, a third dead space DS3 may be disposed outside the third corner portion CS3 in plan view as illustrated in FIG. 2b. The third dead space DS3 may be defined as an empty space in which the third corner portion CS3 is not disposed in a third corner area connecting the second edge portion ES2 and the fourth edge portion ES4 to each other.

The fourth corner portion CS4 may be disposed between the third edge portion ES4 and the fourth edge portion ES4. The fourth corner portion CS4 is not disposed between the third side surface portion SS3 and the fourth side surface portion SS4, and an empty space may thus be provided between the third side surface portion SS3 and the fourth side surface portion SS4. A width of the fourth corner portion CS4 may be smaller than a width of the third edge portion ES3 and a width of the fourth edge portion ES4. For this reason, a fourth dead space DS4 may be disposed outside the fourth corner portion CS4 in plan view as illustrated in FIG. 2b. The fourth dead space DS4 may be defined as an empty space in which the fourth corner portion CS4 is not disposed in a fourth corner area connecting the third edge portion ES3 and the fourth edge portion ES4 to each other.

Meanwhile, as illustrated in FIG. 2b, a first intersection point CP1 between the first bending line BL1 and the second bending line BL2 may overlap the first corner portion CS1. In this case, a strain may be applied to the first corner portion CS1 due to a force with which the first edge portion ES1 and the first side surface portion SS1 are bent and a force with which the second edge portion ES2 and the second side surface portion SS2 are bent.

Figure 3A:
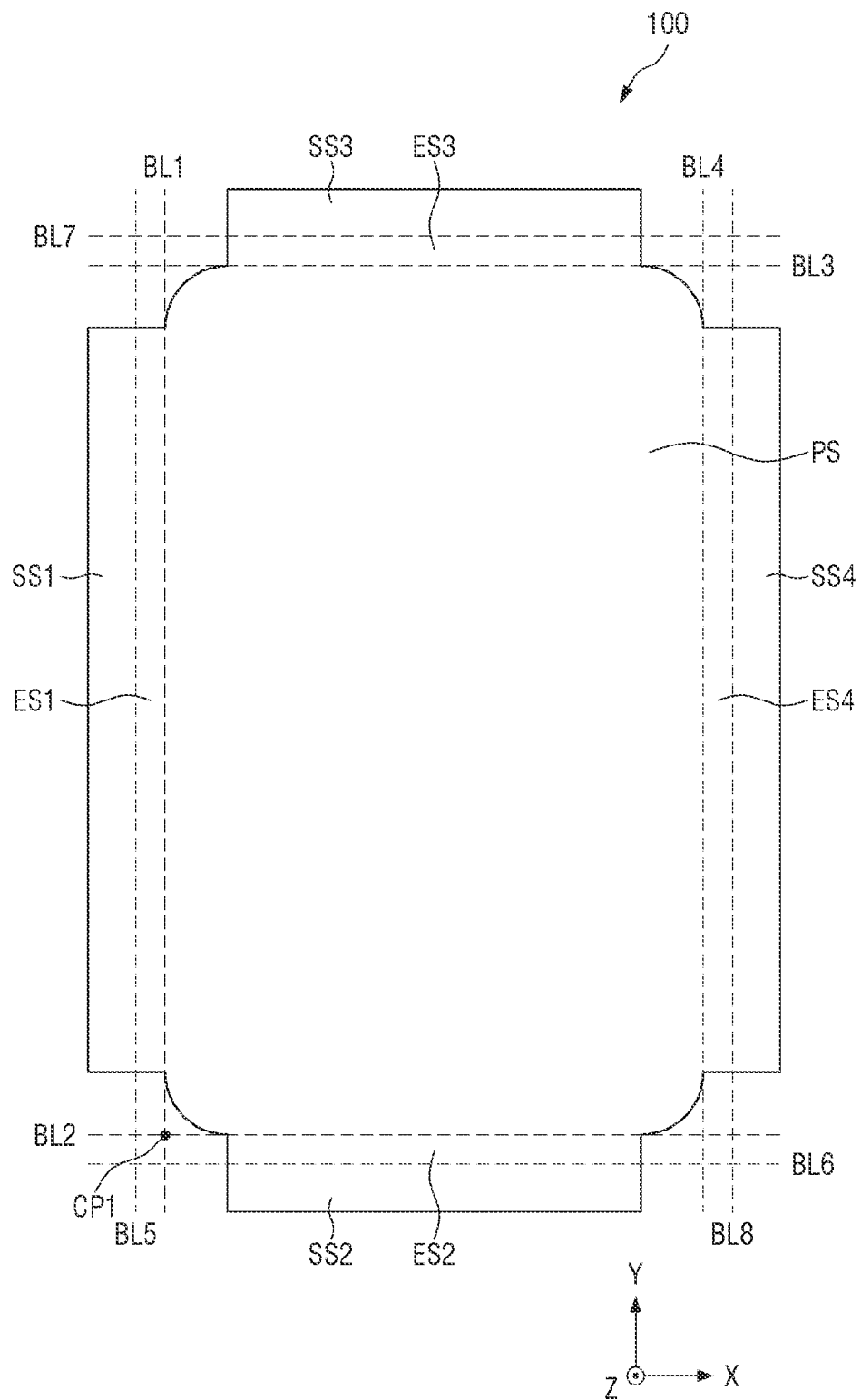
FIGS. 3a and 3b are, respectively, a development view and a plan view of the display panel when first to fourth intersection points of first to fourth bending lines overlap first to fourth corner portions.
Figure 3B:
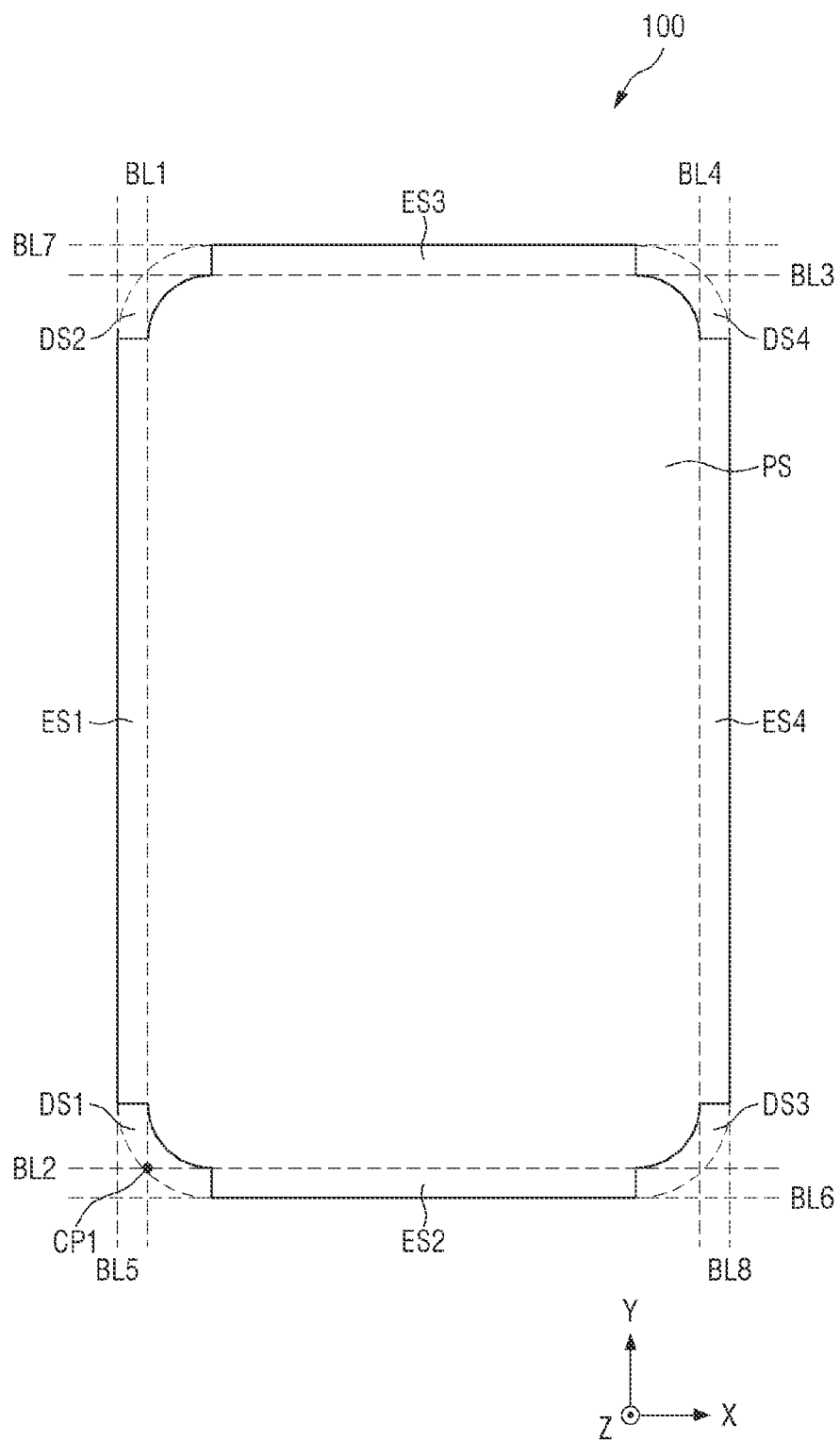

In order to reduce or eliminate the strain applied to the first corner portion CS1, as illustrated in FIGS. 3a and 3b, the first intersection point CP1 between the first bending line BL1 and the second bending line BL2 might not overlap the first corner portion CS1. That is, the first intersection point CP1 between the first bending line BL1 and the second bending line BL2 may be disposed outside the first corner portion CS1. However, a width of the first dead space DS1 may be greater when the first intersection point CP1 is disposed outside the first corner portion CS1 as illustrated in FIG. 3b than when the first intersection point CP1 overlaps the first corner portion CS1 as illustrated in FIG. 2b. Therefore, in order to reduce the width of the first dead space DS1, it may be suitable that the first intersection point CP1 between the first bending line BL1 and the second bending line BL2 overlap the first corner portion CS1, and the strain applied to the first corner portion CS1 may be suitably reduced.

Figure 4:
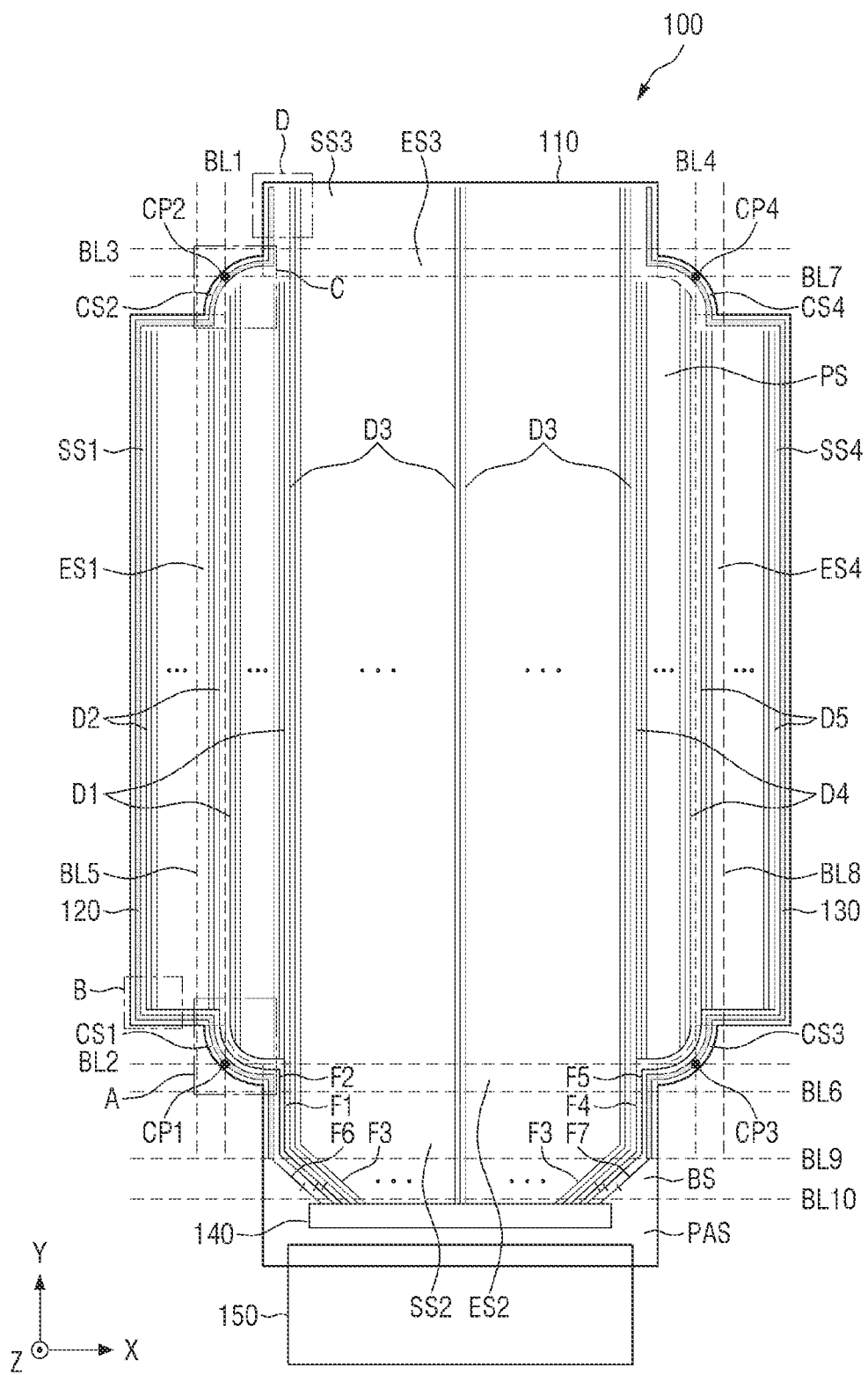
FIG. 4 is a development view illustrating an unbent state of the display panel according to an embodiment.

FIG. 4 is a development view illustrating an unbent state of the display panel according to some embodiments.

In FIG. 4, for convenience of explanation, data lines D1, D2, D3, D4, and D5 fan-out lines F1, F2, F3, F4, F5, F6, and F7, a first scan driver 120, a second scan driver 130, an integrated driving circuit 140, and a circuit board 150 disposed on the substrate 110 have been illustrated.

Referring to FIG. 4, the substrate 110 may include the planar portion PS, the first side surface portion SS1, the second side surface portion SS2, the third side surface portion SS3, the fourth side surface portion SS4, the first edge portion ES1, the second edge portion ES2, the third edge portion ES3, the fourth edge portion ES4, the first corner portion CS1, the second corner portion CS2, the third corner portion CS3, the fourth corner portion CS4, a bending portion BS, and a pad portion PAS.

The planar portion PS, the first side surface portion SS1, the second side surface portion SS2, the third side surface portion SS3, the fourth side surface portion SS4, the first edge portion ES1, the second edge portion ES2, the third edge portion ES3, the fourth edge portion ES4, the first corner portion CS1, the second corner portion CS2, the third corner portion CS3, and the fourth corner portion CS4 are the same as those described with reference to FIGS. 1, 2a, and 2b, and a repeated description thereof will thus be omitted.

The bending portion BS may extend from a first side of the second side surface portion SS2. The bending portion BS may extend from a lower side of the second side surface portion SS2. The bending portion BS may be disposed between the second side surface portion SS2 and the pad portion PAS. The bending portion BS may be a surface bent at a curvature (e.g., predetermined curvature) in a ninth bending line BL9 and a tenth bending line BL10. The ninth bending line BL9 may be a boundary between the second side surface portion SS2 and the bending portion BS, and the tenth bending line BL10 may be a boundary between the bending portion BS and the pad portion PAS.

The pad portion PAS may extend from a first side of the bending portion BS. The pad portion PAS may extend from a lower side of the bending portion BS. The pad portion PAS may be a rectangular surface having short sides in the third direction (Z-axis direction) and long sides in the first direction (X-axis direction).

The data lines D1, D2, D3, D4, and D5 may be formed to be elongated in the second direction (Y-axis direction). The data lines D1, D2, D3, D4, and D5 may be arranged side by side.

First data lines D1 may be disposed in the planar portion PS. The first data lines D1 may overlap the first corner portion CS1 and the second corner portion CS2 in the second direction (Y-axis direction). The first data lines D1 may be connected to first fan-out lines F1 at the planar portion PS adjacent to the first corner portion CS1.

Second data lines D2 may be disposed in the first side surface portion SS1 and the first edge portion ES1. The second data lines D2 may be connected to second fan-out lines F2 at the first side surface portion SS1 and the first edge portion ES1.

Third data lines D3 may be disposed in the planar portion PS, the second side surface portion SS2, and the third side surface portion SS3. The third data lines D3 may be connected to third fan-out lines F3 at the second side surface portion SS2.

Fourth data lines D4 may be disposed in the planar portion PS. The fourth data lines D4 may overlap the third corner portion CS3 and the fourth corner portion CS4 in the second direction (the Y-axis direction). The fourth data lines D4 may be connected to fourth fan-out lines F4 at the planar portion PS adjacent to the third corner portion CS3.

Fifth data lines D5 may be disposed in the fourth side surface portion SS4 and the fourth edge portion ES4. The fifth data lines D5 may be connected to the fourth fan-out lines F4 at the fourth side surface portion SS4 and the fourth edge portion ES4.

The first data lines D1 may be disposed between the second data lines D2 and the third data lines D3. The fourth data lines D4 may be disposed between the third data lines D3 and the fifth data lines D5.

The fan-out lines F1, F2, F3, F4, F5, F6, and F7 may connect the integrated driving circuit 140 disposed in the pad portion PAS to the data lines D1, D2, D3, D4, and D5, the first scan driver 120, and the second scan driver 130.

The first fan-out lines F1 may connect the integrated driving circuit 140 and the first data lines D1 to each other. The first fan-out lines F1 may be disposed in the pad portion PAS, the bending portion BS, the second side surface portion SS2, and the planar portion PS. The first fan-out lines F1 may be connected to the integrated driving circuit 140 at the pad portion PAS. The first fan-out lines F1 may be connected to the first data lines D1 at the planar portion PS adjacent to the first corner portion CS1.

The second fan-out lines F2 may connect the integrated driving circuit 140 and the second data lines D2 to each other. The second fan-out lines F2 may be disposed in the pad portion PAS, the bending portion BS, the second side surface portion SS2, the first corner portion CS1, the first edge portion ES1, and the first side surface portion SS1. The second fan-out lines F2 may be connected to the integrated driving circuit 140 at the pad portion PAS. The second fan-out lines F2 may be connected to the second data lines D2 at the first edge portion ES1 and the first side surface portion SS1.

The third fan-out lines F3 may connect the integrated driving circuit 140 and the third data lines D3 to each other. The third fan-out lines F3 may be disposed in the pad portion PAS, the bending portion BS, and the second side surface portion SS2. The third fan-out lines F3 may be connected to the integrated driving circuit 140 at the pad portion PAS. The third fan-out lines F3 may be connected to the third data lines D3 at the second side surface portion SS2.

The fourth fan-out lines F4 may connect the integrated driving circuit 140 and the fourth data lines D4 to each other. The fourth fan-out lines F4 may be disposed in the pad portion PAS, the bending portion BS, the second side surface portion SS2, and the planar portion PS. The fourth fan-out lines F4 may be connected to the integrated driving circuit 140 at the pad portion PAS. The fourth fan-out lines F4 may be connected to the fourth data lines D4 at the planar portion PS adjacent to the third corner portion CS3.

Fifth fan-out lines F5 may connect the integrated driving circuit 140 and the fifth data lines D5 to each other. The fifth fan-out lines F5 may be disposed in the pad portion PAS, the bending portion BS, the second side surface portion SS2, the planar portion PS, the fourth edge portion ES4, and the fourth side surface portion SS4. The fifth fan-out lines F5 may be connected to the integrated driving circuit 140 at the pad portion PAS. The fifth fan-out lines F5 may be connected to the fifth data lines D5 at the fourth edge portion ES4 and the fourth side surface portion SS4.

Sixth fan-out lines F6 may connect the integrated driving circuit 140 and the first scan driver 120 to each other. The sixth fan-out lines F6 may be connected to the integrated driving circuit 140 at the pad portion PAS. The sixth fan-out lines F6 may be connected to the first scan driver 120 at the second side surface portion SS2. The sixth fan-out lines F6 may overlap the first scan driver 120 at the second side surface portion SS2, the second edge portion ES2, the first corner portion CS1, the first edge portion ES1, the first side surface portion SS1, the second corner portion CS2, the third edge portion ES3, and the third side surface portion SS3. Therefore, the sixth fan-out lines F6 may be disposed in the pad portion PAS, the bending portion BS, the second side surface portion SS2, the second edge portion ES2, the first corner portion CS1, the first edge portion ES1, the first side surface portion SS1, the second corner portion CS2, the third edge portion ES3, and the third side surface portion SS3. Meanwhile, the sixth fan-out lines F6 are lines for supplying scan control signals to the first scan driver 120, and may thus be referred to as first scan control lines.

Seventh fan-out lines F7 may connect the integrated driving circuit 140 and the second scan driver 130 to each other. The seventh fan-out lines F7 may be connected to the integrated driving circuit 140 at the pad portion PAS. The seventh fan-out lines F7 may be connected to the second scan driver 130 at the second side surface portion SS2. The seventh fan-out lines F7 may overlap the second scan driver 130 at the second side surface portion SS2, the second edge portion ES2, the third corner portion CS3, the fourth edge portion ES4, the fourth side surface portion SS4, the fourth corner portion CS4, the third edge portion ES3, and the third side surface portion SS3. The seventh fan-out lines F6 may be disposed in the pad portion PAS, the bending portion BS, the second side surface portion SS2, the second edge portion ES2, the third corner portion CS3, the fourth edge portion ES4, the fourth side surface portion SS4, the fourth corner portion CS4, the third edge portion ES3, and the third side surface portion SS3. Meanwhile, the seventh fan-out lines F7 are lines for supplying scan control signals to the second scan driver 130, and may thus be referred to as second scan control lines.

The first scan driver 120 may be disposed on an edge of a first side of the substrate 110, and the second scan driver 130 may be disposed on an edge of a second side of the substrate 110 opposite to the first side of the substrate 110. For example, as illustrated in FIG. 4, the first scan driver 120 may be disposed on an edge of a left side of the substrate 110, and the second scan driver 130 may be disposed on an edge of a right side of the substrate 110. Any one of the first scan driver 120 and the second scan driver 130 may be omitted. For example, as illustrated in FIG. 4, the first scan driver 120 may be disposed in the third side surface portion SS3, the second edge portion ES2, the first corner portion CS1, the first edge portion ES1, the first side surface portion SS1, the second corner portion CS2, the third edge portion ES3, and the third side surface portion SS3. In addition, the second scan driver 130 may be disposed in the third side surface portion SS3, the second edge portion ES2, the third corner portion CS3, the fourth edge portion ES4, the fourth side surface portion SS4, the fourth corner portion CS4, the third edge portion ES3, and the third side surface portion SS3, as illustrated in FIG. 4.

The first scan driver 120 and the second scan driver 130 may be connected to scan lines. The scan lines may be formed to be elongated in the first direction (X-axis direction). The scan lines may cross the data lines.

The first scan driver 120 may be connected to the sixth fan-out lines F6 at the third side surface portion SS3. Therefore, the first scan driver 120 may receive the scan control signals from the integrated driving circuit 140 through the sixth fan-out lines F6. The first scan driver 120 may generate scan signals according to the scan control signals and output the scan signals to the scan lines.

The second scan driver 130 may be connected to the seventh fan-out lines F7 at the third side surface portion SS3. Therefore, the second scan driver 130 may receive the scan control signals from the integrated driving circuit 140 through the seventh fan-out lines F7. The second scan driver 130 may generate scan signals according to the scan control signals and output the scan signals to the scan lines.

The integrated driving circuit 140 may be disposed in the pad portion PAS. The integrated driving circuit 140 may be formed as an integrated circuit (IC). The integrated driving circuit 140 may be disposed on the substrate 110 in a chip on glass (COG) manner, a chip on plastic (COP) manner, or an ultrasonic bonding manner. Alternatively, the integrated driving circuit 140 may be disposed on the circuit board 150 in a chip on plastic (COP) manner.

The integrated driving circuit 140 may be connected to pads of the pad portion PAS. The integrated driving circuit 140 may receive digital video data and timing signals through the pads of the pad portion PAS. The integrated driving circuit 140 may generate the scan control signals using the timing signals. The scan control signals may include a start signal and clock signals. The integrated driving circuit 140 may convert the digital video data into analog data voltages.

The integrated driving circuit 140 may be connected to the fan-out lines F1, F2, F3, F4, F5, F6, and F7. The integrated driving circuit 140 may output the scan control signals to the sixth fan-out lines F6 and the seventh fan-out lines F7. The integrated driving circuit 140 may output the analog data voltages to the first to fifth fan-out lines F1, F2, F3, F4, and F5.

The circuit board 150 may be attached onto the pads of the pad portion PAS using an anisotropic conductive film. Lead lines of the circuit board 150 may be electrically connected to the pads of the pad portion PAS. The circuit board 150 may be a flexible film such as a flexible printed circuit board, a printed circuit board, or a chip on film.

Figure 5:
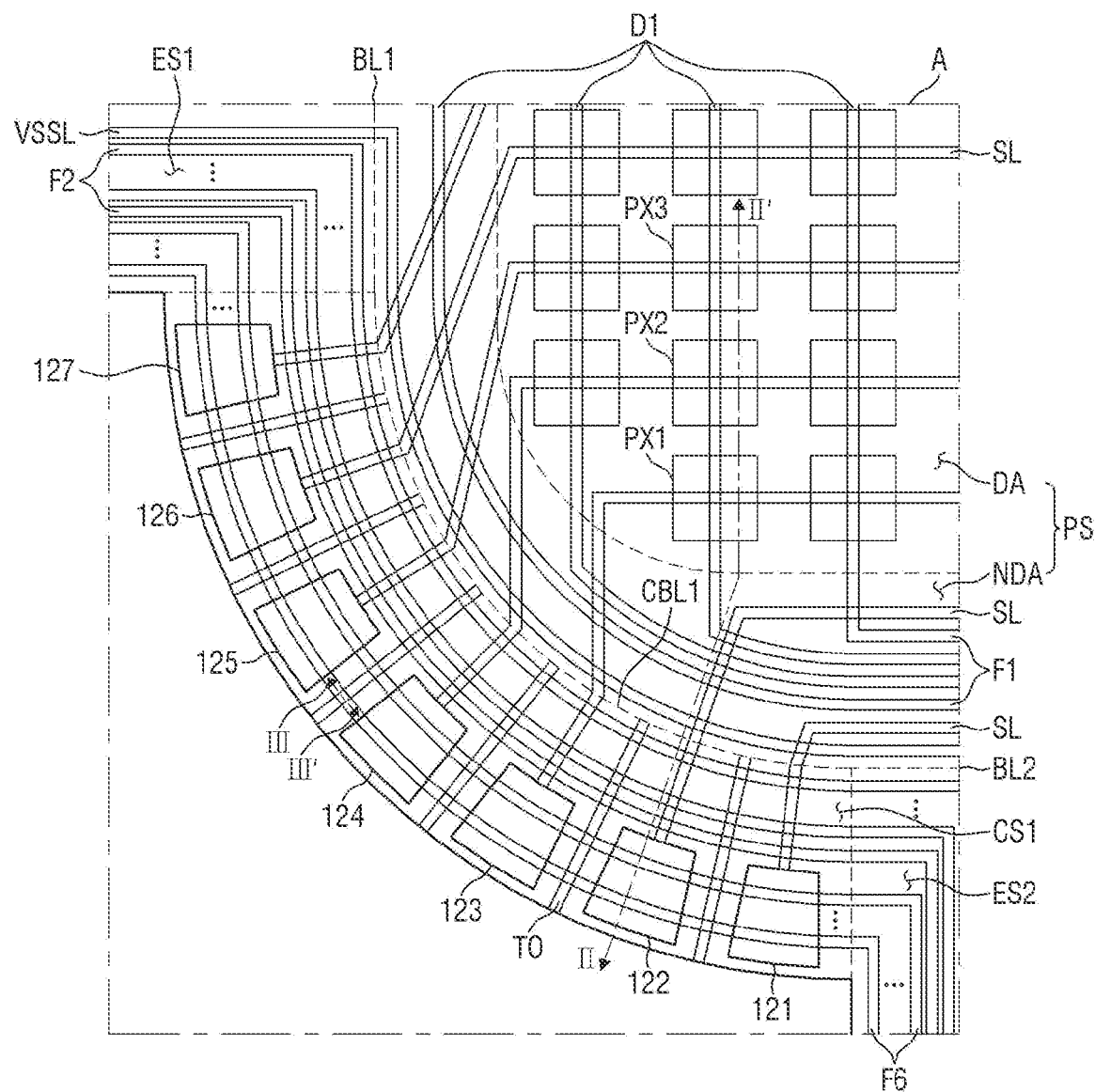
FIG. 5 is an enlarged plan view illustrating an example of area A of FIG. 4.
Figure 6:
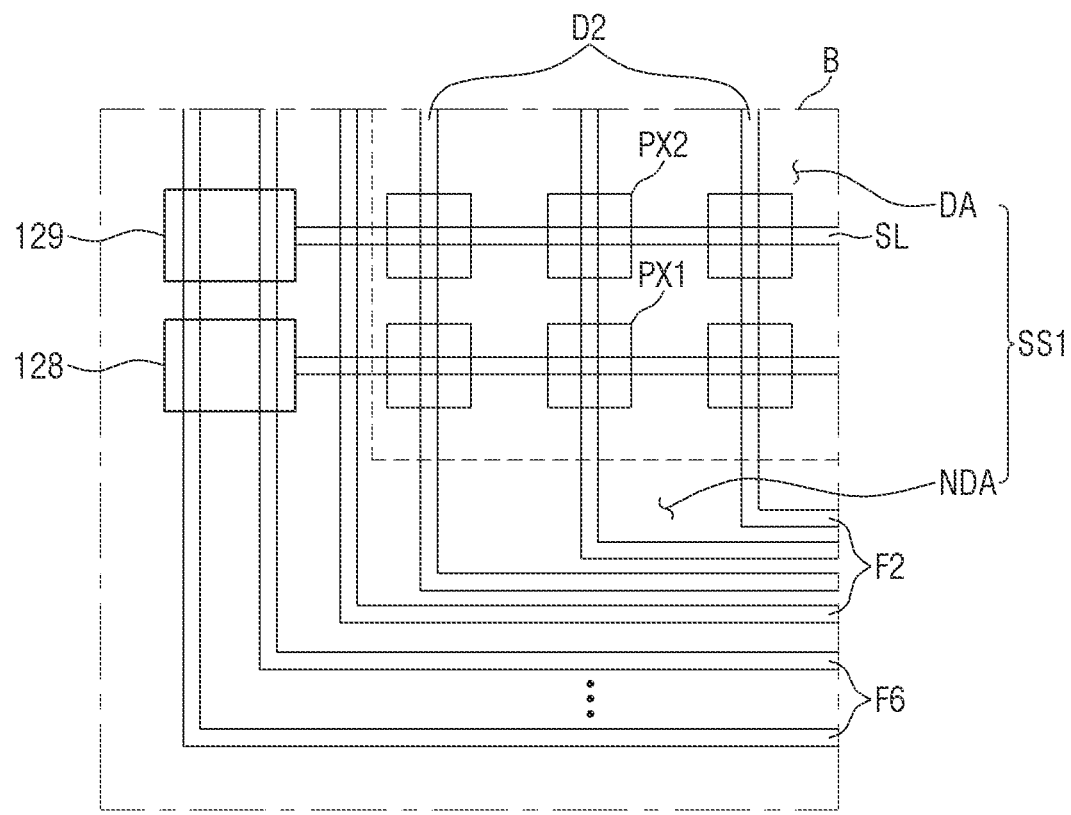
FIG. 6 is an enlarged plan view illustrating an example of area B of FIG. 4.

FIG. 5 is an enlarged plan view illustrating an example of area A of FIG. 4. FIG. 6 is an enlarged plan view illustrating an example of area B of FIG. 4.

FIG. 5 is an enlarged plan view illustrating the first corner portion CS1, and the planar portion PS, the first edge portion ES1, and the second edge portion ES2 around the first corner portion CS1 in detail. FIG. 6 is an enlarged plan view illustrating the first side surface portion SS1 in detail.

Referring to FIGS. 5 and 6, the planar portion PS and the first side surface portion SS1 may include a display area DA and a non-display area NDA. The first data lines D1, scan lines SL, and pixels PX may be disposed in the display area DA of the planar portion PS adjacent to the first corner portion CS1. The second data lines D2, scan lines SL, and pixels PX may be disposed in the display area DA of the first side surface portion SS1.

Figure 7:
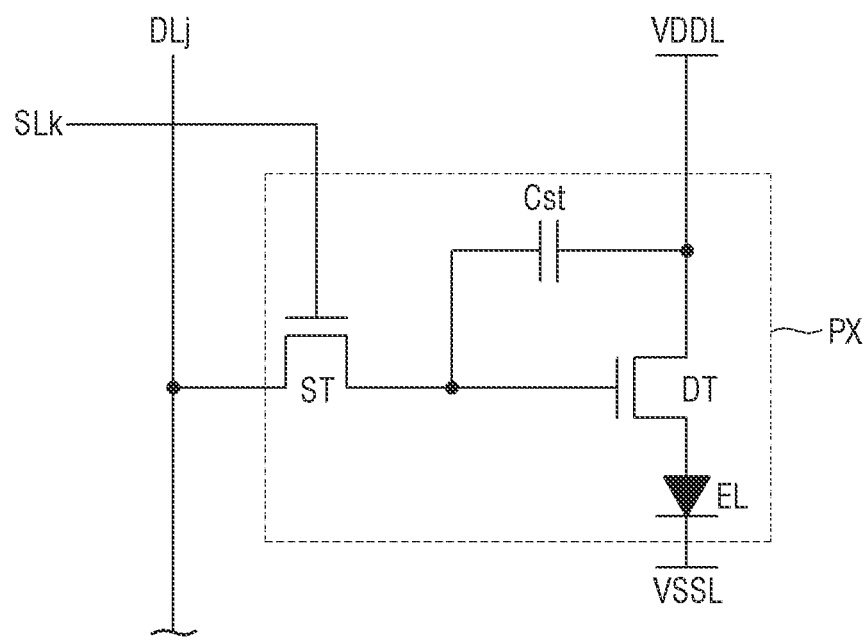
FIG. 7 is a circuit diagram illustrating an example of a pixel of FIG. 5.

The first data lines D1 and the second data lines D2 may be disposed in the second direction (Y-axis direction). The scan lines SL may be disposed in the first direction (X-axis direction). The pixels PX may be disposed in areas defined by crossings between the scan lines SL and the data lines D1 and D2. Each of the pixels PX may be connected to at least one scan line SL and at least one first data line D1 or second data line D2. Each of the pixels PX may include a light emitting element EL as illustrated in FIG. 7 to emit light. The pixels PX will be described in detail later with reference to FIG. 7.

The first fan-out lines F1 may be disposed in the non-display area NDA of the planar portion PS. A first power line VSSL may be disposed in the non-display area NDA of the planar portion PS and the non-display area NDA of the first side surface portion SS1.

A first source voltage applied to a second electrode of the light emitting element EL of each of the pixels PX may be applied to the first power line VSSL. The first power line VSSL may be electrically connected to the second electrode of the light emitting element EL of each of the pixels PX. In the non-display area NDA of the planar portion PS, the first power line VSSL may be disposed closer to the first corner portion CS1 than the first fan-out lines F1. In the non-display area NDA of the first side surface portion SS1, the first power line VSSL may be disposed farther from the first scan driver 120 than the second fan-out lines F2.

The first fan-out lines F1 may be connected to the first data lines D1, respectively. The first data lines D1 refer to data lines overlapping the first corner portion CS1 and the second corner portion CS2 in the second direction (Y-axis direction). As illustrated in FIG. 5, the first fan-out line F1 connected to the first data line D1 adjacent to the second edge portion ES2 may be shorter than the first fan-out line F1 connected to the first data line D1 adjacent to the first edge portion ES1.

The first corner portion CS1 refers to an area disposed outside a first corner bending line CBL1 defined by the first bending line BL1 and the second bending line BL2. The first corner portion CS1 may be a non-display area in which the pixels PXs emitting light are not present. The first scan driver 120 and the second fan-out lines F2 may be disposed in the first corner portion CS1.

The first scan driver 120 may be disposed outside the second fan-out lines F2. In the first corner portion CS1, the first scan driver 120 may be disposed on a left side of the second fan-out lines F2. The first scan driver 120 may be disposed closer to an end of the substrate 110 than the second fan-out lines F2.

The first scan driver 120 may include stages 121 to 129 that are subordinately connected to each other and sequentially output scan signals. The stages 121 to 129 may be disposed along a curvature of the first corner portion CS1 as illustrated in FIG. 5 in the first corner portion CS1, and may be disposed along the long sides in the second direction (Y-axis direction) as illustrated in FIG. 6 in the first side surface portion SS1. The stages 121 to 129 are not disposed along the short sides in the first direction (X-axis direction) in the first side surface portion SS1.

The first scan driver 120 and the sixth fan-out lines F6 may be disposed in the second edge portion ES2, the first corner portion CS1, the first edge portion ES1, and the first side surface portion SS1. The stages 121 to 129 may overlap the sixth fan-out lines F6. Each of the stages 121 to 129 may be connected to the sixth fan-out lines F6 and the scan lines SL. Each of the stages 121 to 129 may receive the scan control signals through the sixth fan-out lines F6, generate scan signals according to the scan control signals, and output the scan signals to the scan lines SL.

In order to reduce the strain of the first corner portion CS1, a tensile force of the first corner portion CS1 may be suitably increased. Therefore, organic film patterns TO may be respectively disposed between respective adjacent ones of stages 121 to 127. The organic film patterns TO may be filled in spaces in which the inorganic films are removed in order to increase the tensile force. The organic film patterns TO may cross the second fan-out lines F2 and the sixth fan-out lines F6.

The second fan-out lines F2 may be disposed in the second edge portion ES2, the first corner portion CS1, the first edge portion ES1, and the first side surface portion SS1. The second fan-out lines F2 are not disposed along the long sides in the second direction (Y-axis direction) in the first side surface portion SS1. The second fan-out lines F2 may pass through the first corner portion CS1 and may be connected to the second data lines D2 at the first edge portion ES1 and the first side surface portion SS1. The second fan-out lines F2 may be disposed closer to the planar portion PS than the first scan driver 120.

Meanwhile, when an encapsulation film is formed in the first corner portion CS1, a crack may occur in the encapsulation film due to the strain of the first corner portion CS1. When the crack occurs in the encapsulation film, the light emitting elements EL of the pixels PX may be exposed to oxygen or moisture. Accordingly, in order to reduce (e.g., prevent) the likelihood of the crack occurring in the encapsulation film due to the strain of the first corner portion CS1, the encapsulation film is not formed in the first corner portion CS1. Therefore, the first scan driver 120, the second fan-out lines F2, and the sixth fan-out lines F6 that do not need to be covered by the encapsulation film are disposed in the first corner portion CS1.

The third corner portion CS3, and the second edge portion ES2, the fourth edge portion ES4, and the fourth side surface portion SS4 around the third corner portion CS3 are substantially the same as those described with reference to FIGS. 5 and 6, and a repeated description thereof will thus be omitted.

FIG. 7 is a circuit diagram illustrating an example of a pixel of FIG. 5.

Referring to FIG. 7, each of the pixels PX may include a driving transistor DT, at least one switching transistor ST, a light emitting element EL, and a capacitor Cst.

The switching transistor ST may be turned on when a scan signal is applied from a k-th (k is a positive integer) scan line SLk thereto. When the switching transistor ST is turned on, a data voltage of a j-th (j is a positive integer) data line DLj may be applied to a gate electrode of the driving transistor DT. A gate electrode of the switching transistor ST may be connected to the k-th scan line SLk, a source electrode of the switching transistor ST may be connected to the gate electrode of the driving transistor DT, and a drain electrode of the switching transistor ST may be connected to the j-th data line DLj.

The driving transistor DT may allow the light emitting element to emit light by supplying a driving current to the light emitting element according to the data voltage applied to the gate electrode thereof. The gate electrode of the driving transistor DT may be connected to the drain electrode of the switching transistor ST, a source electrode of the driving transistor DT may be connected to a first electrode of the light emitting element EL, and a drain electrode of the driving transistor DT may be connected to a second power line VDDL to which a second source voltage is applied.

The driving transistor DT and the at least one switching transistor ST may be thin film transistors. In addition, it has been illustrated in FIG. 7 that the driving transistor DT and the at least one switching transistor ST are formed as N-type semiconductor transistors having N-type semiconductor characteristics, but embodiments of the present specification are not limited thereto. That is, the driving transistor DT and the at least one switching transistor ST may be formed as P-type semiconductor transistors having P-type semiconductor characteristics.

The light emitting element EL may be an organic light emitting diode including a first electrode, a second electrode, and an organic light emitting layer disposed between the first electrode and the second electrode. Alternatively, the light emitting element EL may be an inorganic light emitting element including a first electrode, a second electrode, and an inorganic semiconductor disposed between the first electrode and the second electrode. Alternatively, the light emitting element EL may be a quantum dot light emitting element including a first electrode, a second electrode, and a quantum dot light emitting layer disposed between the first electrode and the second electrode. Alternatively, the light emitting element EL may be a micro light emitting diode.

The light emitting element EL may emit light according to the driving current of the driving transistor DT. The first electrode of the light emitting element EL may be connected to the drain electrode of the driving transistor DT, and the second electrode of the light emitting element EL may be connected to the first power line VSSL to which the first source voltage lower than the second source voltage is applied. The first electrode of the light emitting element EL may be an anode electrode, and the second electrode of the light emitting element EL may be a cathode electrode.

The capacitor Cst may be connected between the gate electrode and the source electrode of the driving transistor DT. Accordingly, the capacitor Cst may serve to constantly maintain the data voltage applied to the gate electrode of the driving transistor DT.

Meanwhile, it should be noted that a structure of each of the pixels PX is not limited to that illustrated in FIG. 7.

Figure 8:
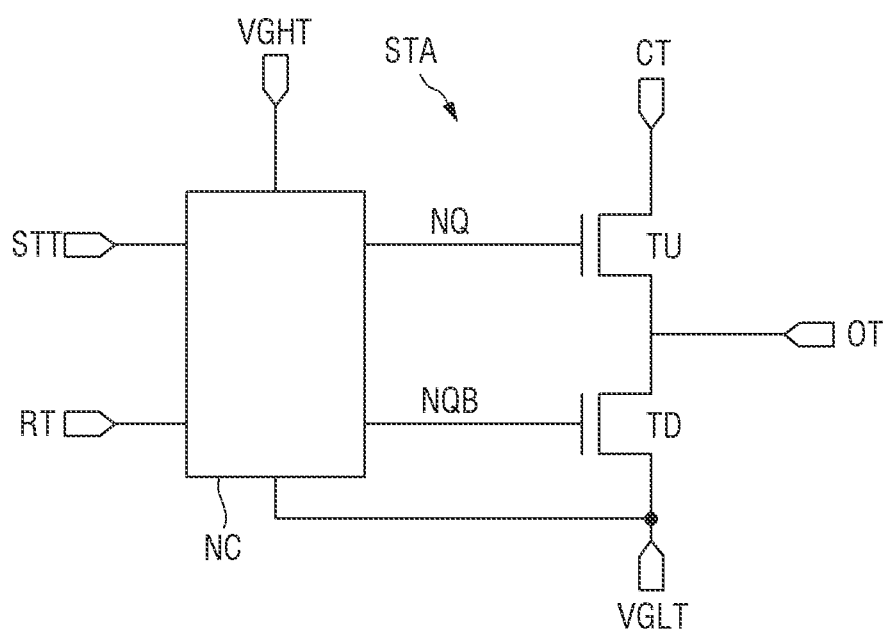
FIG. 8 is a circuit diagram illustrating an example of a stage of a scan driver of FIG. 5.

FIG. 8 is a circuit diagram illustrating an example of a stage of a scan driver of FIG. 5.

Referring to FIG. 8, the first scan driver 120 may include a plurality of stages STAs, and the stages STAs may sequentially output scan signals to the scan lines SL. Each of the stages STA may receive a scan control signal and output scan signals, and the scan control signal may include a start signal, a gate-on voltage, a gate-off voltage, and a clock signal.

Each of the stages STA includes a pull-up node NQ, a pull-down node NQB, a pull-up transistor TU turned on when the pull-up node NQ has the gate-on voltage, a pull-down transistor TD turned on when the pull-down node NQB has the gate-on voltage, and a node controller NC for controlling charging/discharging of the pull-up node NQ and the pull-down node NQB, as illustrated in FIG. 8.

The node controller NC may be connected to a start terminal ST to which the start signal or an output signal of the previous stage is input, a reset terminal RT to which an output signal of the next stage is input, a gate-on voltage terminal VGHT to which the gate-on voltage is applied, and a gate-off voltage terminal VGLT to which the gate-off voltage is applied. The node controller NC controls the charging/discharging of the pull-up node NQ and the pull-down node NQB according to the start signal or the output signal of the previous stage input to the start terminal ST. The node controller NC allows the pull-down node NQB to have the gate-off voltage when the pull-up node NQ has the gate-on voltage and allows the pull-up node NQ to have the gate-off voltage when the pull-down node NQB has the gate-on voltage, in order to stably control an output of the stage STA. To this end, the node controller NC may include a plurality of transistors.

The pull-up transistor TU is turned on to output a clock signal input to a clock terminal CT to an output terminal OT, when the stage STA is pulled up, that is, when the pull-up node NQ has the gate-on voltage. The pull-down transistor TD is turned on to output a gate-off voltage of the gate-off voltage terminal VGLT to the output terminal OT, when the stage STA is pulled down, for example, when the pull-down node NQB has the gate-on voltage.

The pull-up transistor TU, the pull-down transistor TD, and the plurality of transistors of the node controller NC of the stage STA may be formed as thin film transistors. In addition, it has been illustrated in FIG. 8 that the pull-up transistor TU, the pull-down transistor TD, and the plurality of transistors of the node controller NC of the stage STA are formed as an N-type semiconductor transistor having N-type semiconductor characteristics, but embodiments of the present specification are not limited thereto. That is, the pull-up transistor TU, the pull-down transistor TD, and the plurality of transistors of the node controller NC of the stage STA may be formed as P-type semiconductor transistors having P-type semiconductor characteristics.

Figure 9:
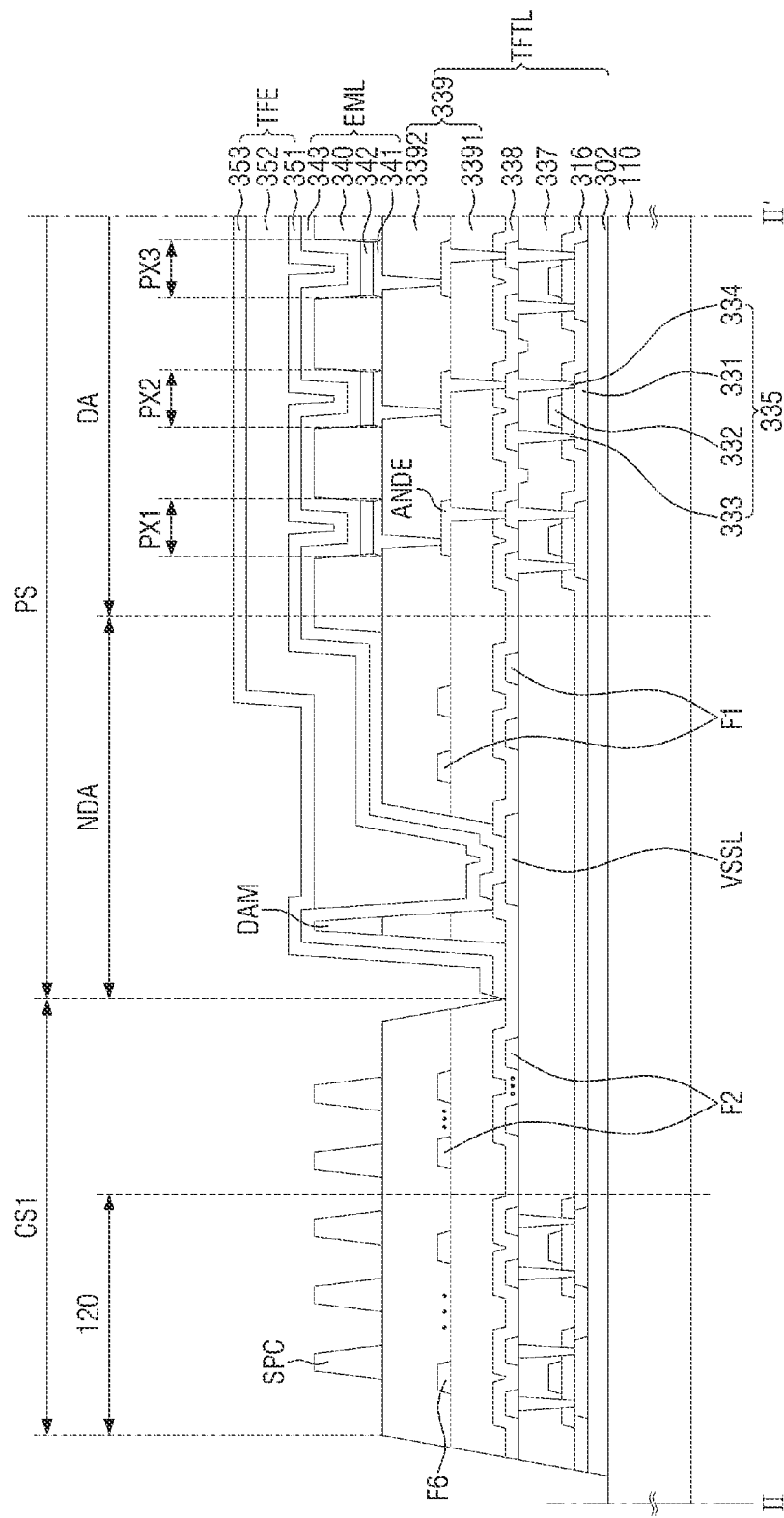
FIG. 9 is a cross-sectional view illustrating an example taken along line II-II' of FIG. 5.
Figure 10:
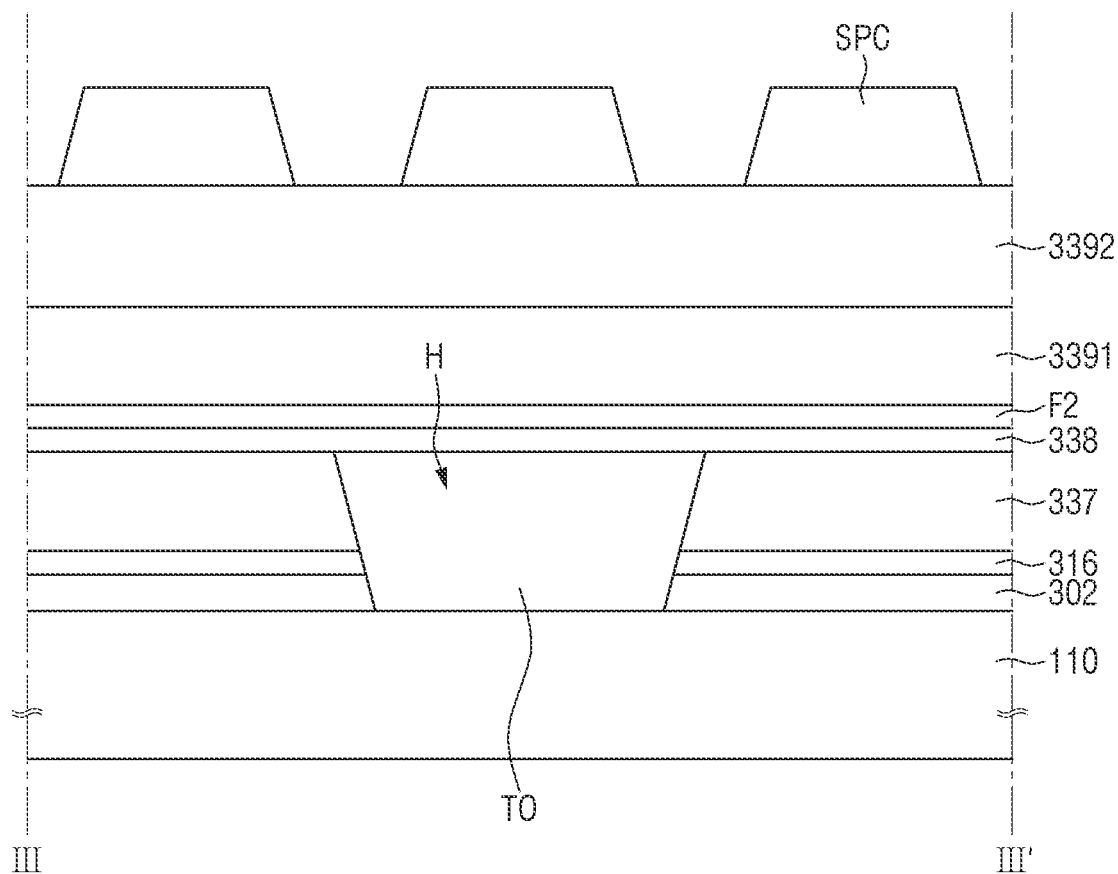
FIG. 10 is a cross-sectional view illustrating an example taken along line III-III' of FIG. 5.

FIG. 9 is a cross-sectional view illustrating an example taken along line II-II' of FIG. 5. FIG. 10 is a cross-sectional view illustrating an example taken along line III-III' of FIG. 5.

In FIG. 9, the non-display area NDA and the display area DA of the first corner portion CS1 and the planar portion PS are illustrated. In FIG. 10, a cross-section of the organic film pattern TO of the first corner portion CS1 is illustrated.

Referring to FIGS. 9 and 10, a thin film transistor layer TFTL, a light emitting element layer EML, and an encapsulation film TFE may be sequentially formed on the substrate 110.

The thin film transistor layer TFTL includes an active layer 331, a gate metal layer, a first source-drain metal layer, a second source-drain metal layer, a buffer film 302, a gate insulating film 316, an interlayer insulating film 337, a protective film 338, a first planarization film 3391, and a second planarization film 3392.

The buffer film 302 may be formed on one surface of the substrate 110. The buffer film 302 may be formed on the substrate 110 in order to protect thin film transistors 335 and light emitting elements from moisture permeating through the substrate 110 vulnerable to moisture permeation. The buffer film 302 may include a plurality of inorganic films that are alternately stacked. For example, the buffer film 302 may be formed as multiple films in which one or more inorganic films of a silicon oxide film (SiOx), a silicon nitride film (SiNx), and SiON are alternately stacked. In some embodiments, the buffer film may be omitted.

The thin film transistors 335 are formed on the buffer film 302. The thin film transistors 335 may be formed in the display area DA of the planar portion PS and the first scan driver 120 disposed in the first corner portion CS1.

Each of the thin film transistors 335 includes the active layer 331, a gate electrode 332, a source electrode 333, and a drain electrode 334. It has been illustrated in FIG. 9 that the thin film transistor 335 is formed in a top gate type in which the gate electrode 332 is positioned above the active layer 331, but it should be noted that the present disclosure is not limited thereto. That is, the thin film transistors 335 may be formed in a bottom gate type in which the gate electrode 332 is positioned below the active layer 331 or a double gate type in which the gate electrodes 332 are positioned both above and below the active layer 331.

The active layer 331 is formed on the buffer film 302. The active layer 331 may be formed of a silicon-based semiconductor material or an oxide-based semiconductor material. A light blocking layer for blocking external light incident to the active layer 331 may be formed between the buffer film and the active layer 331.

The gate insulating film 316 may be formed on the active layer 331. The gate insulating film 316 may be formed as an inorganic film, for example, a silicon oxide film (SiOx), a silicon nitride film (SiNx), or multiple films thereof.

The gate metal layer including the gate electrodes 332 and the scan lines SL may be formed on the gate insulating film 316. The gate metal layer may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

The interlayer insulating film 337 may be formed on the gate metal layer. The interlayer insulating film 337 may be formed as an inorganic film, for example, a silicon oxide film (SiOx), a silicon nitride film (SiNx), or multiple films thereof.

The first source-drain metal layer including the source electrodes 333, the drain electrodes 334, the first power line VSSL, the data lines D1, D2, D3, D4, and D5, and some of the first and second fan-out lines F1 and F2 may be formed on the interlayer insulating film 337. Some of the third to fifth fan-out lines F3, F4, and F5 may also be formed in the first source-drain metal layer. Each of the source electrode 333 and the drain electrode 334 may be connected to the active layer 331 through contact holes penetrating through the gate insulating film 316 and the interlayer insulating film 337. The first source-drain metal layer may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

At the first corner portion CS1, the organic film patterns TO may be disposed in holes H penetrating through the buffer film BF, the gate insulating film 316, and the interlayer insulating film 337 to expose the substrate 110. The tensile force of the first corner portion CS1 may be increased by forming the organic film patterns TO in the spaces in which the inorganic films are removed, and thus, occurrence of cracks in the inorganic films due to the strains of the first corner portion CS1 may be reduced. The organic film pattern TO may be formed as an organic film made of an acryl resin, an epoxy resin, a phenolic resin, a polyamide resin, a polyimide resin, or the like.

The protective film 338 for insulating the thin film transistors 335 may be formed on the first source-drain metal layer. The protective film 338 may be formed as an inorganic film, for example, a silicon oxide film (SiOx), a silicon nitride film (SiNx), or multiple films thereof.

The first planarization film 3391 for planarizing a step caused by the thin film transistors 335 may be formed on the protective film 338. The first planarization film 3391 may be formed as an organic film made of an acryl resin, an epoxy resin, a phenolic resin, a polyamide resin, a polyimide resin, or the like.

The second source-drain metal layer including anode connection electrodes ANDE and others of the first and second fan-out lines F1 and F2 may be formed on the first planarization film 3391. Others of the third to fifth fan-out lines F3, F4, and F5 may also be formed in the second source-drain metal layer. The anode connection electrodes ANDE may be connected to the source electrodes 333 or the drain electrodes 334 through contact holes penetrating through the protective film 338 and the first planarization film 3391.

The second source-drain metal layer may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

Because the first and second fan-out lines F1 and F2 are formed at a high density in a narrow area such as the non-display area NDA of the planar portion PS and the first corner portion CS1, some of the first and second fan-out lines F1 and F2 may be formed as the first source-drain metal layer, and the others of the first and second fan-out lines F1 and F2 may be formed as the second source-drain metal layer. For a similar reason, some of the third to fifth fan-out lines F3, F4, and F5 may be formed as the first source-drain metal layer, and others of the third to fifth fan-out lines F3, F4, and F5 may be formed as the second source-drain metal layer. In this case, some of the first to fifth fan-out lines F1, F2, F3, F4, and F5 and others of the first to fifth fan-out lines F1, F2, F3, F4, and F5 may be alternately arranged, as illustrated in FIG. 9. In addition, some of the first to fifth fan-out lines F1, F2, F3, F4, and F5 and others of the first to fifth fan-out lines F1, F2, F3, F4, and F5 might not overlap each other as illustrated in FIG. 9.

At the pad portion PAS and the bending portion BS at which the sixth fan-out lines F6 and the first scan driver 120 do not overlap each other, some of the sixth fan-out lines F6 may be formed as the first source-drain metal layer, and others of the sixth fan-out lines F6 may be formed as the second source-drain metal layer. Therefore, some of the sixth fan-out lines F6 and others of the sixth fan-out lines F6 may be alternately arranged. In addition, some of the sixth fan-out lines F6 and others of the sixth fan-out lines F6 might not overlap each other. In addition, at the second side surface portion SS2, the second edge portion ES2, the first corner portion CS1, the first edge portion ES1, the first side surface portion SS1, the second corner portion CS2, the third edge portion ES3, and the third side surface portion SS3 at which the sixth fan-out lines F6 and the first scan driver 120 overlap each other, the sixth fan-out lines F6 may be formed as the second source-drain metal layer, as illustrated in FIG. 9.

At the pad portion PAS and the bending portion BS at which the seventh fan-out lines F7 and the second scan driver 130 do not overlap each other, some of the seventh fan-out lines F7 may be formed as the first source-drain metal layer, and others of the seventh fan-out lines F7 may be formed as the second source-drain metal layer. Therefore, some of the seventh fan-out lines F7 and others of the seventh fan-out lines F7 may be respectively alternately arranged. In addition, some of the seventh fan-out lines F7 and others of the seventh fan-out lines F7 might not overlap each other. In addition, at the second side surface portion SS2, the second edge portion ES2, the third corner portion CS3, the fourth edge portion ES4, the fourth side surface portion SS4, the fourth corner portion CS4, the third edge portion ES3, and the third side surface portion SS3 at which the seventh fan-out lines F7 and the second scan driver 130 overlap each other, the seventh fan-out lines F7 may be formed as the second source-drain metal layer.

The second planarization film 3392 may be formed on the second source-drain metal layer. The second planarization film 3392 may be formed as an organic film made of an acryl resin, an epoxy resin, a phenolic resin, a polyamide resin, a polyimide resin, or the like.

The light emitting element layer EML is formed on the thin film transistor layer TFTL. The light emitting element layer EML includes light emitting elements and a pixel defining film 340.

The light emitting elements and the pixel defining film 340 are formed on the planarization film 339. Each of the light emitting elements may include a first electrode 341, an organic light emitting layer 342, and a second electrode 343.

The first electrode 341 may be formed on the second planarization film 3392. The first electrode 341 may be connected to the anode connection electrode ANDE through a contact hole penetrating through the second planarization film 3392.

In a top emission structure in which light is emitted toward the second electrode 343 based on the organic light emitting layer 342, the first electrode 341 may be formed of a metal material having high reflectivity, such as a stacked structure (Ti/Al/Ti) of aluminum and titanium, a stacked structure (ITO/Al/ITO) of aluminum and indium tin oxide (ITO), an APC alloy, and a stacked structure (ITO/APC/ITO) of an APC alloy and ITO. The APC alloy is an alloy of silver (Ag), palladium (Pd), and copper (Cu).

The pixel defining film 340 may be formed to partition the first electrodes 341 on the second planarization film 3392 in order to serve to define an emission area EA of each of pixels PX1, PX2, and PX3. The pixel defining film 340 may be formed to cover an edge of the first electrode 341. The pixel defining film 340 may be formed as an organic film made of an acryl resin, an epoxy resin, a phenolic resin, a polyamide resin, a polyimide resin, or the like.

In addition, spacers SPC may be formed on the second planarization film 3392 in the first corner portion CS1. The spacers SPC may be made of the same material as the pixel defining film 340 and disposed on the same layer as the pixel defining film 340.

Each of the pixels PX1, PX2, and PX3 refers to an area in which the first electrode 341, the organic light emitting layer 342, and the second electrode 343 are sequentially stacked, and holes from the first electrode 341 and electrons from the second electrode 343 are combined with each other in the organic light emitting layer 342 to emit light.

The organic light emitting layer 342 is formed on the first electrode 341 and the pixel defining film 340. The organic light emitting layer 342 may include an organic material to emit light of a color (e.g., predetermined color). For example, the organic light emitting layer 342 may include a hole transporting layer, an organic material layer, and an electron transporting layer. The organic light emitting layer 342 of the first pixel PX1 may emit light of a first color, the organic light emitting layer 342 of the second pixel PX2 may emit light of a second color, and the organic light emitting layer 342 of the third pixel PX3 may emit light of a third color. Alternatively, the organic light emitting layers 342 of the pixels PX1, PX2, and PX3 may emit white light, and in this case, the first pixel PX1 may overlap a color filter layer of a first color, the second pixel PX2 may overlap a color filter layer of a second color, and the third pixel PX3 may overlap a color filter layer of a third color. In the present specification, for convenience of explanation, it has been mainly described that the first color is red, the second color is green, and the third color is blue.

The second electrode 343 is formed on the organic light emitting layer 342. The second electrode 343 may be formed to cover the organic light emitting layer 342. The second electrode 343 may be a common layer commonly formed in the pixels PX1, PX2, and PX3. A capping layer may be formed on the second electrode 343.

The second electrode 343 may be connected to the first power line VSSL in the non-display area NDA of the planar portion PS. The second electrode 343 may be connected to the first power line VSSL through a contact hole penetrating through the first planarization film 3391 and the second planarization film 3392.

In the top emission structure, the second electrode 343 may be formed of a transparent conductive material (TCO) such as ITO or indium zinc oxide (IZO) capable of transmitting light therethrough or a semi-transmissive conductive material such as magnesium (Mg), silver (Ag), or an alloy of magnesium (Mg) and silver (Ag). When the second electrode 343 is formed of the semi-transmissive conductive material, emission efficiency may be increased by a micro cavity.

The encapsulation film TFE may be formed on the light emitting element layer EML. The encapsulation film TFE may include at least one inorganic film in order to reduce (e.g., prevent) oxygen or moisture penetrating into the light emitting element layer EML. In addition, the encapsulation film TFE may include at least one organic film in order to protect the light emitting element layer EML from foreign materials such as dust. For example, the encapsulation film TFE may include a first inorganic film 351 disposed on the second electrode 343, an organic film 352 disposed on the first inorganic film 351, and a second inorganic film 353 disposed on the organic film 352.

A dam DAM may be disposed in the non-display area NDA of the planar portion PS. The dam DAM may be disposed to cover or overlap a portion of the first power line VSSL. The first planarization film 3391, the second planarization film 3392, the pixel defining film 340, and the organic film 352 of the encapsulation film TFE may be blocked by the dam DAM, and the first inorganic film 351 and the second inorganic film 353 of the encapsulation film TFE may be in contact with each other on the dam DAM. The first inorganic film 351 and the second inorganic film 353 of the encapsulation film TFE may be arranged so as not to go beyond the first corner bending line CBL1.

The encapsulation film TFE is disposed to cover the display area DA and the non-display area NDA of the planar portion PS, but is not disposed to cover the first corner portion CS1. Therefore, the first scan driver 120, the second fan-out lines F2, and the sixth fan-out lines F6 of the first corner portion CS1 are not covered by the encapsulation film TFE.

It has been illustrated in FIG. 9 that the first scan driver 120, the second fan-out lines F2, and the sixth fan-out lines F6 of the first corner portion CS1 are not covered by the first inorganic film 351, the organic film 352, and the second inorganic film 353 of the encapsulation film TFE, but the present disclosure is not limited thereto. For example, the first scan driver 120, the second fan-out lines F2, and the sixth fan-out lines F6 of the first corner portion CS1 might not be covered by the first inorganic film 351 and the second inorganic film 353 of the encapsulation film TFE, and may be covered by the organic film 352 of the encapsulation film TFE.

Figure 19:
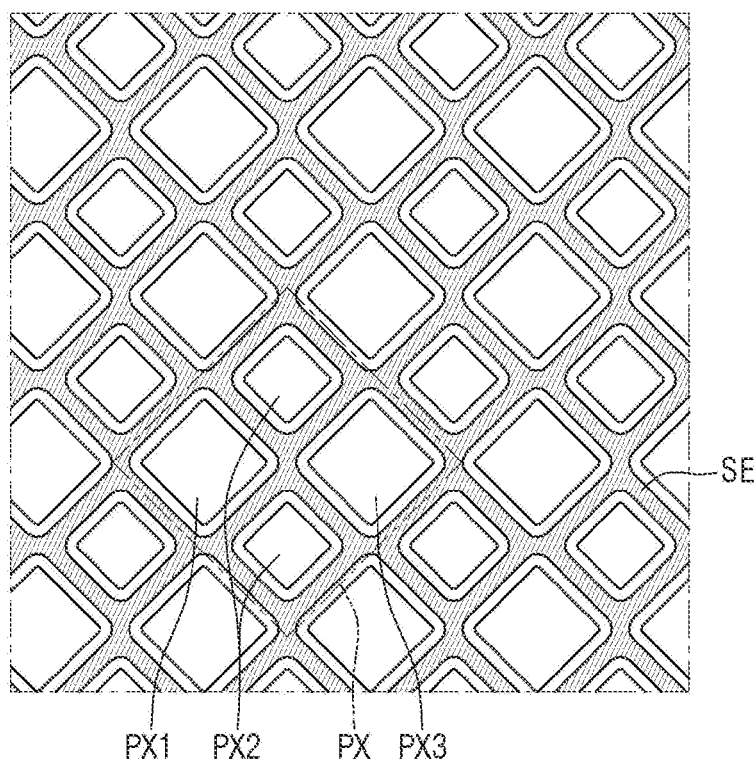
FIG. 19 is a plan view illustrating an example of a sensor electrode disposed on an encapsulation film of FIG. 9.

A sensor electrode layer, in which sensor electrodes SE (see FIG. 19) for sensing a user's touch input or proximity input are disposed, may be disposed on the encapsulation film TFE. When the sensor electrodes SE overlap the first to third pixels PX1, PX2, and PX3, the first to third pixels PX1, PX2, and PX3 are hidden by the sensor electrodes SE. Therefore, the sensor electrodes SE might not overlap the first to third pixels PX1, PX2, and PX3, as illustrated in FIG. 19. The sensor electrodes SE may overlap the pixel defining film 340. For example, the sensor electrodes SE may be formed in a mesh shape or a net shape in plan view as illustrated in FIG. 19.

The sensor electrodes SE may sense the user's touch input or proximity input as a self-capacitance type or a mutual capacitance type. In the self-capacitance type, the sensor electrodes SE may be formed on one layer. In the mutual capacitance type, the sensor electrodes SE may include driving electrodes, sensing electrodes, and connection electrodes connecting adjacent driving electrodes or sensing electrodes to each other. In the mutual capacitance type, the driving electrodes, the sensing electrodes, and the connection electrodes may be formed on one layer. Alternatively, in the mutual capacitance type, the driving electrodes and the sensing electrodes may be formed on a first layer, the connection electrodes may be formed on a second layer, and the first layer and the second layer may be electrically separated from each other by an insulating film.

It has been illustrated in FIG. 19 that each of the first to third pixels PX1, PX2, and PX3 is formed in a rectangular shape such as a rhombic shape in plan view, but the present disclosure is not limited thereto. Each of the first to third pixels PX1, PX2, and PX3 may be formed in a polygonal shape other than a circular shape or a rectangular shape in plan view.

As illustrated in FIG. 19, one first pixel PX1, two second pixels PX2, and one first pixel PX3 may be defined as one unit pixel PX. In this case, a size of the second pixel PX2 may be smaller than a size of the first pixel PX1 or a size of the third pixel PX3. One unit pixel PX refers to a group of pixels capable of expressing a white gradation.

The strain may be applied to the first corner portion CS1 due to the force with which the first edge portion ES1 and the first side surface portion SS1 are bent and the force with which the second edge portion ES2 and the second side surface portion SS2 are bent. When the encapsulation film TFE is formed in the first corner portion CS1, a crack may occur in the encapsulation film TFE due to the strain of the first corner portion CS1. When the crack occurs in the encapsulation film, the light emitting elements EL of the pixels PX may be exposed to oxygen or moisture. Accordingly, in order to reduce (e.g., prevent) the likelihood of a crack occurring in the encapsulation film TFE due to the strain of the first corner portion CS1, the encapsulation film TFE is not formed in the first corner portion CS1. Because the light emitting element layer EML is not formed in the first corner portion CS1, the corner portion does not need to be covered by the encapsulation film TFE. Therefore, the first scan driver 120, the second fan-out lines F2, and the sixth fan-out lines F6 of the first corner portion CS1 are not covered by the encapsulation film TFE.

Figure 11:
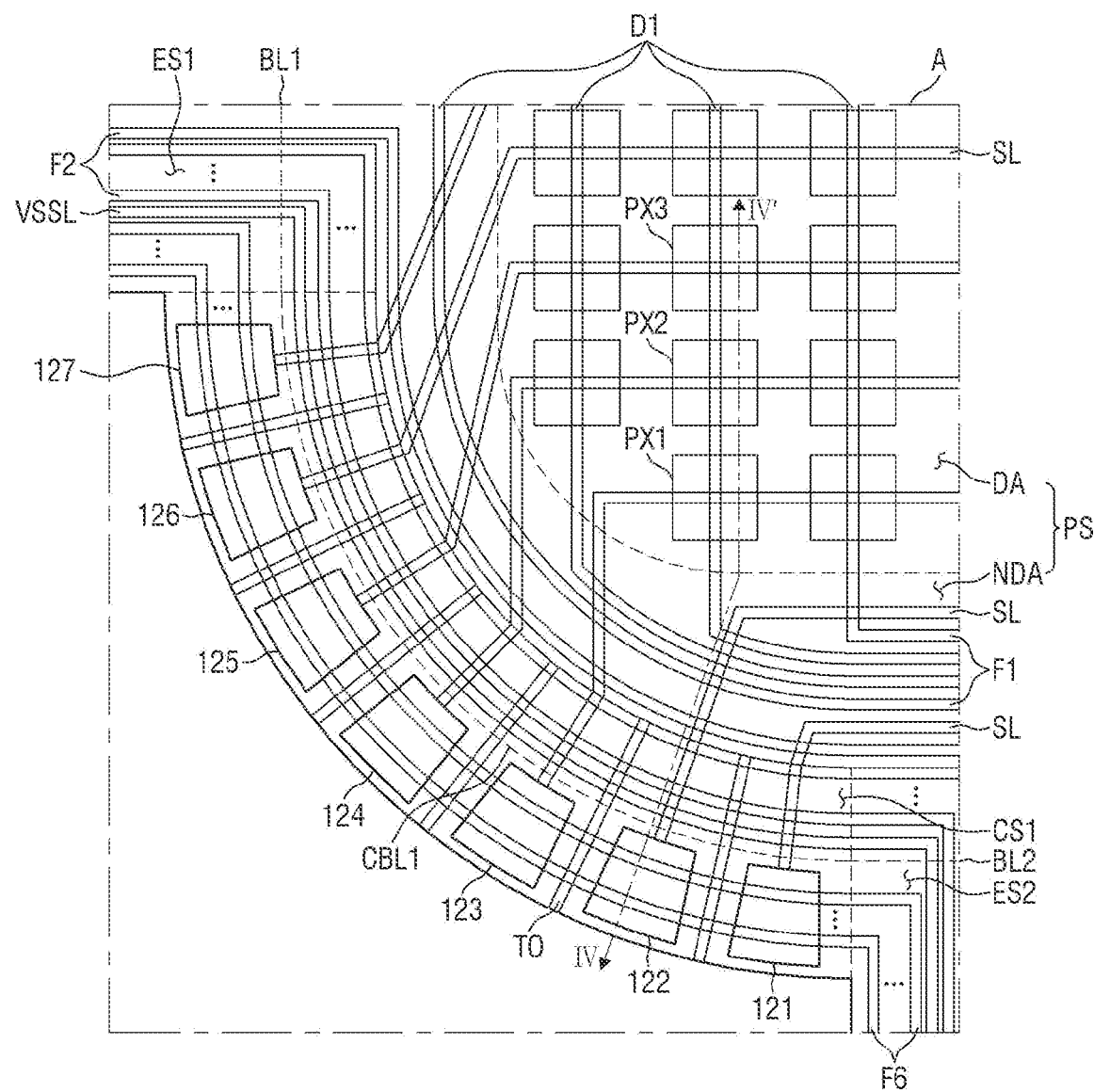
FIG. 11 is an enlarged plan view illustrating an example of area A of FIG. 4.
Figure 12:
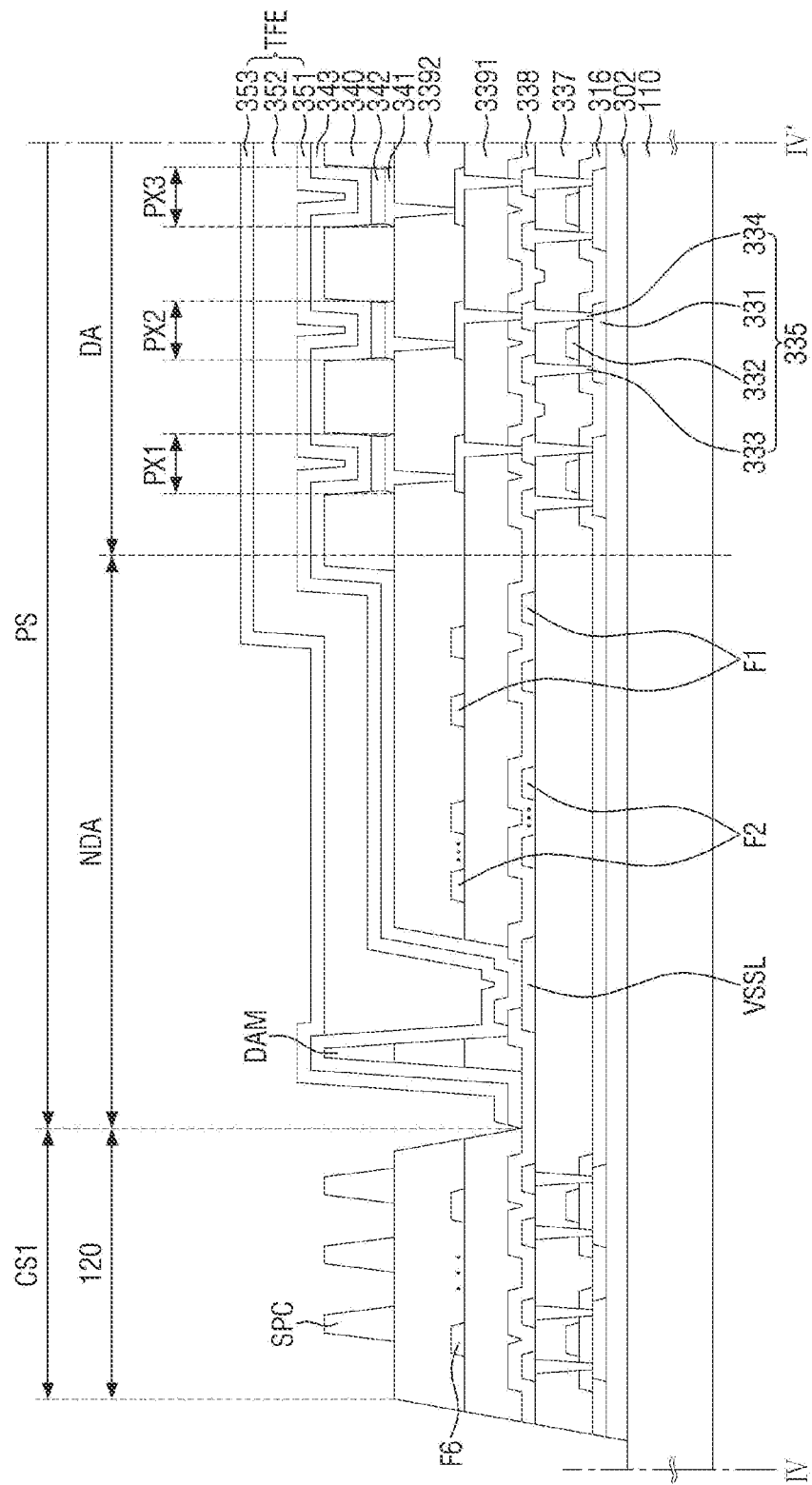
FIG. 12 is a cross-sectional view illustrating an example taken along line IV-IV' of FIG. 11.

Meanwhile, it has been illustrated in FIGS. 5 and 9 that the second fan-out lines F2 are disposed at the first corner portion CS1 and are not covered by the encapsulation film TFE, but the present disclosure is not limited thereto. For example, as illustrated in FIGS. 11 and 12, the second fan-out lines F2 may be disposed in the non-display area NDA of the planar portion PS rather than the first corner portion CS1. In this case, in the non-display area NDA of the planar portion PS, the second fan-out lines F2 may be disposed closer to the first corner portion CS1 than the first fan-out lines F1. In addition, in the non-display area NDA of the planar portion PS, the second fan-out lines F2 may be disposed between the first power line VSSL and the first fan-out lines F1.

Figure 13:
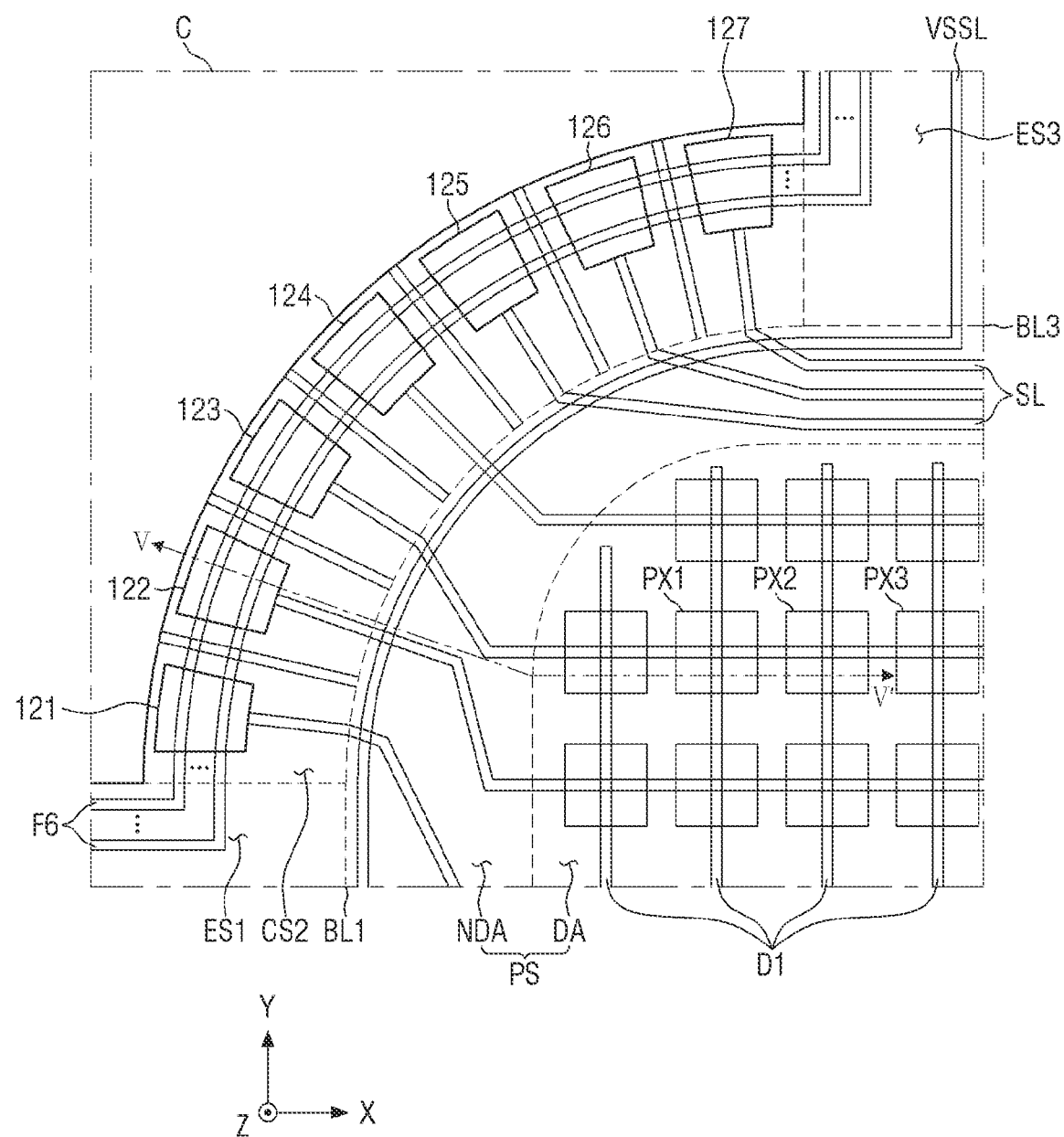
FIG. 13 is an enlarged plan view illustrating an example of area C of FIG. 4.
Figure 14:
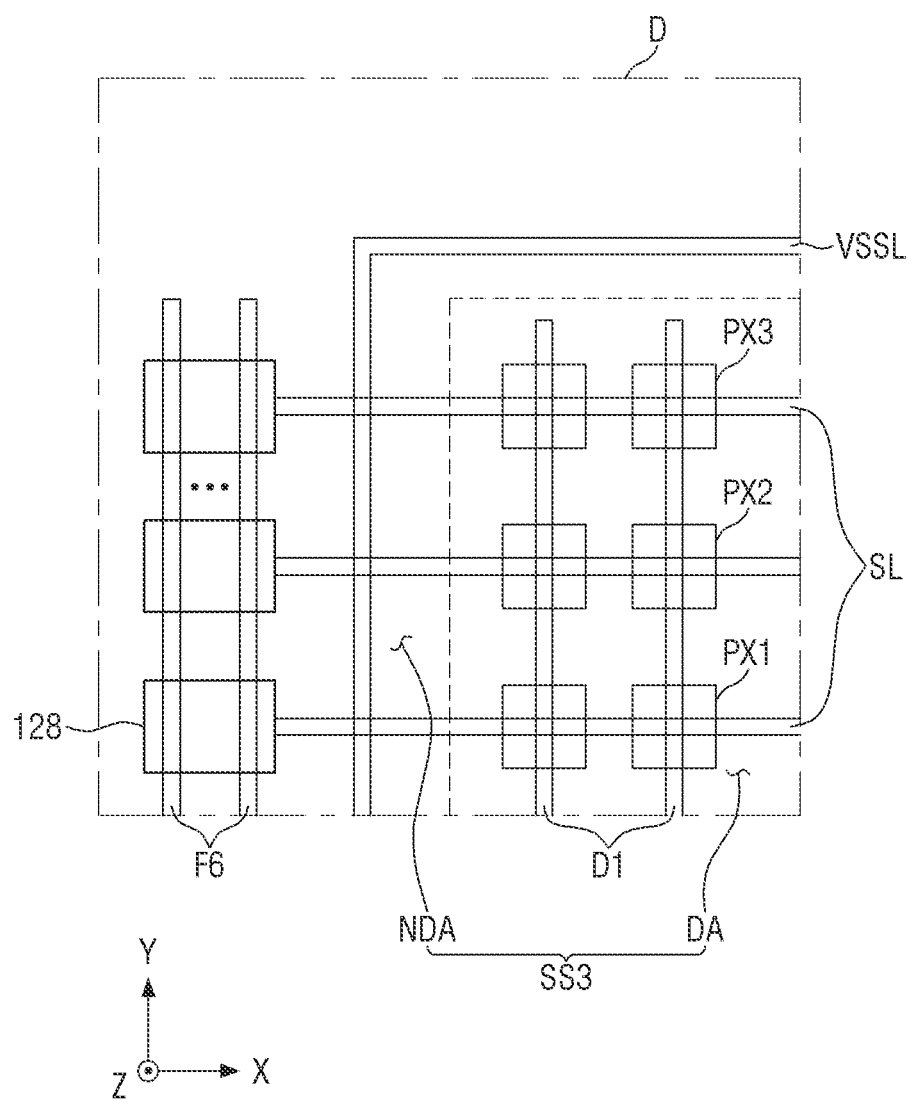
FIG. 14 is an enlarged plan view illustrating an example of area D of FIG. 4.
Figure 15:
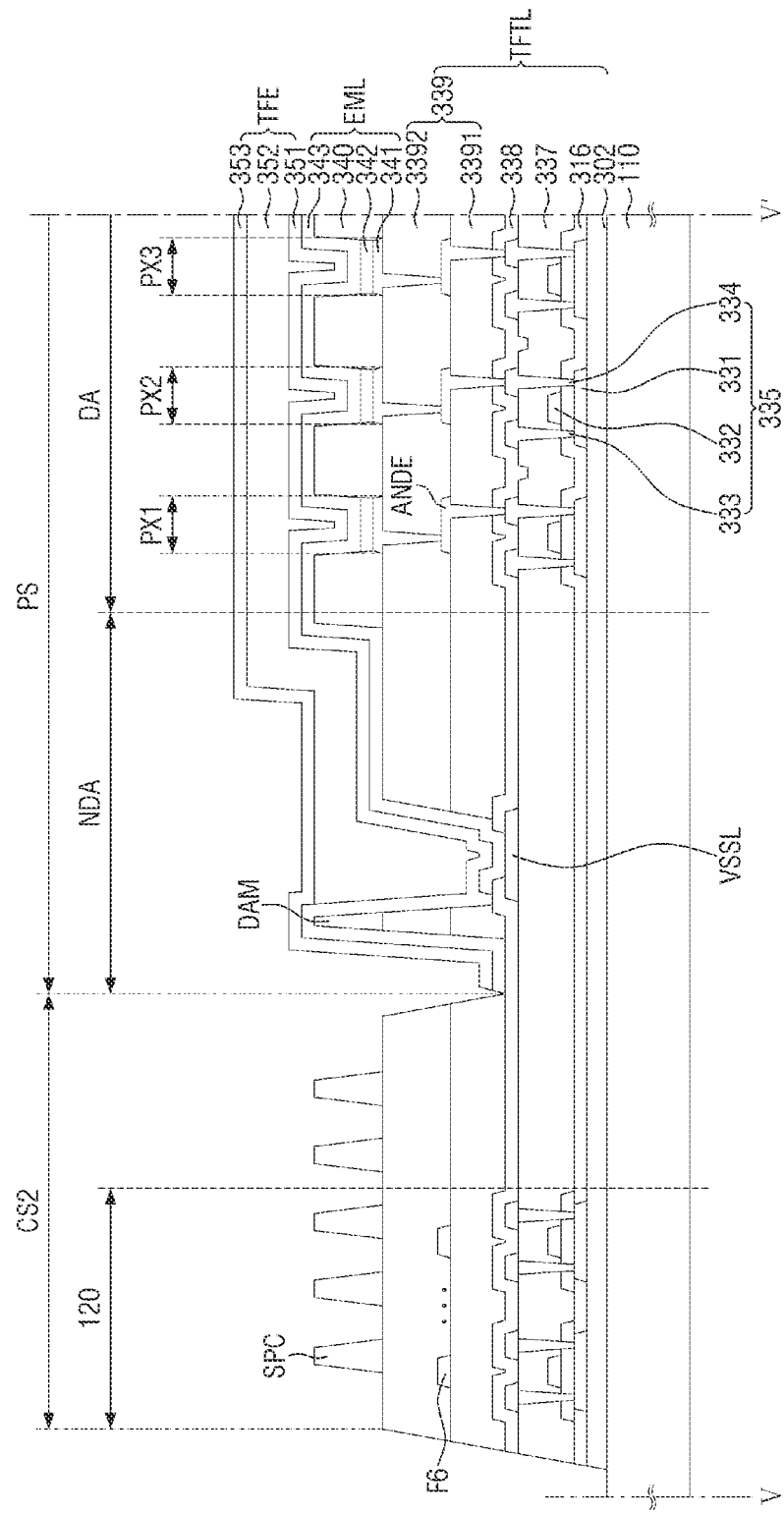
FIG. 15 is a cross-sectional view illustrating an example taken along line V-V' of FIG. 13.

FIG. 13 is an enlarged plan view illustrating an example of area C of FIG. 4. FIG. 14 is an enlarged plan view illustrating an example of area D of FIG. 4. FIG. 15 is a cross-sectional view illustrating an example taken along line V-V' of FIG. 13.

FIG. 13 is an enlarged plan view illustrating the second corner portion CS2, and the planar portion PS, the second edge portion ES2, and the third edge portion ES3 around the second corner portion CS2 in detail. FIG. 14 is an enlarged plan view illustrating the third side surface portion SS3 in detail.

Embodiments illustrated in FIGS. 13 to 15 are different from embodiments illustrated in FIGS. 5, 6, and 9 in that the first fan-out lines F1 and the second fan-out lines F2 are omitted. Therefore, in FIGS. 13 to 15, descriptions overlapping those of embodiments illustrated in FIGS. 5, 6, and 9 will be omitted.

Referring to FIGS. 13 to 15, the first fan-out lines F1 are connected to the first data lines D1 at the planar portion PS around the first corner portion CS1 as illustrated in FIG. 5, and are thus disposed in the pad portion PAS, the bending portion BS (see FIG. 4), the second side surface portion SS2 (see FIG. 4), and the planar portion PS. Therefore, the first fan-out lines F1 do not exist in the planar portion PS around the second corner portion CS2. In addition, the second fan-out lines F2 are connected to the second data lines D2 at a lower short side of the first side surface portion SS1 as illustrated in FIG. 6, and are thus disposed in the pad portion PAS, the bending portion BS, the second side surface portion SS2, the first corner portion CS1, the first edge portion ES1, and the first side surface portion SS1. Therefore, the second fan-out lines F2 do not exist in the second corner portion CS2.

Figure 16:
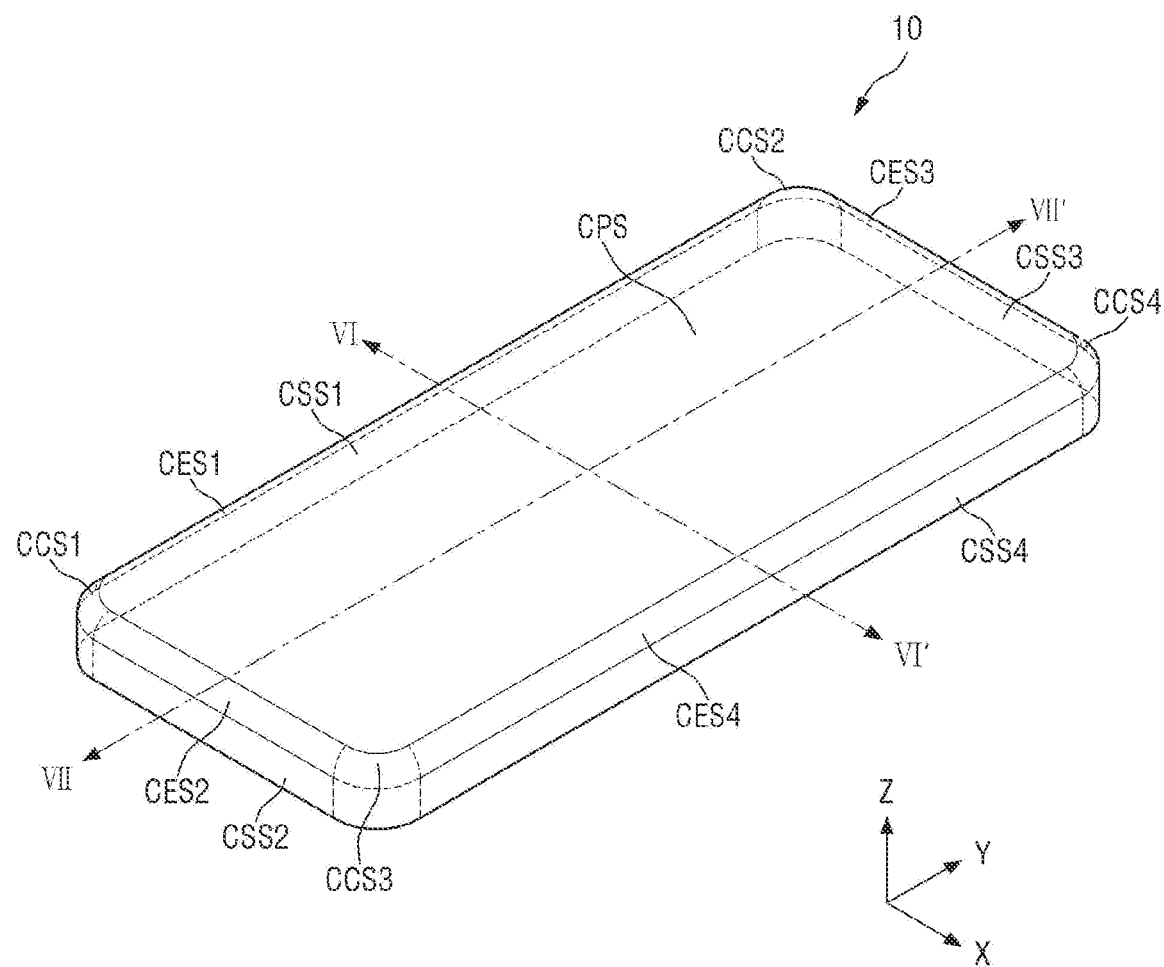
FIG. 16 is a perspective view illustrating a display device according to some embodiments.
Figure 17:
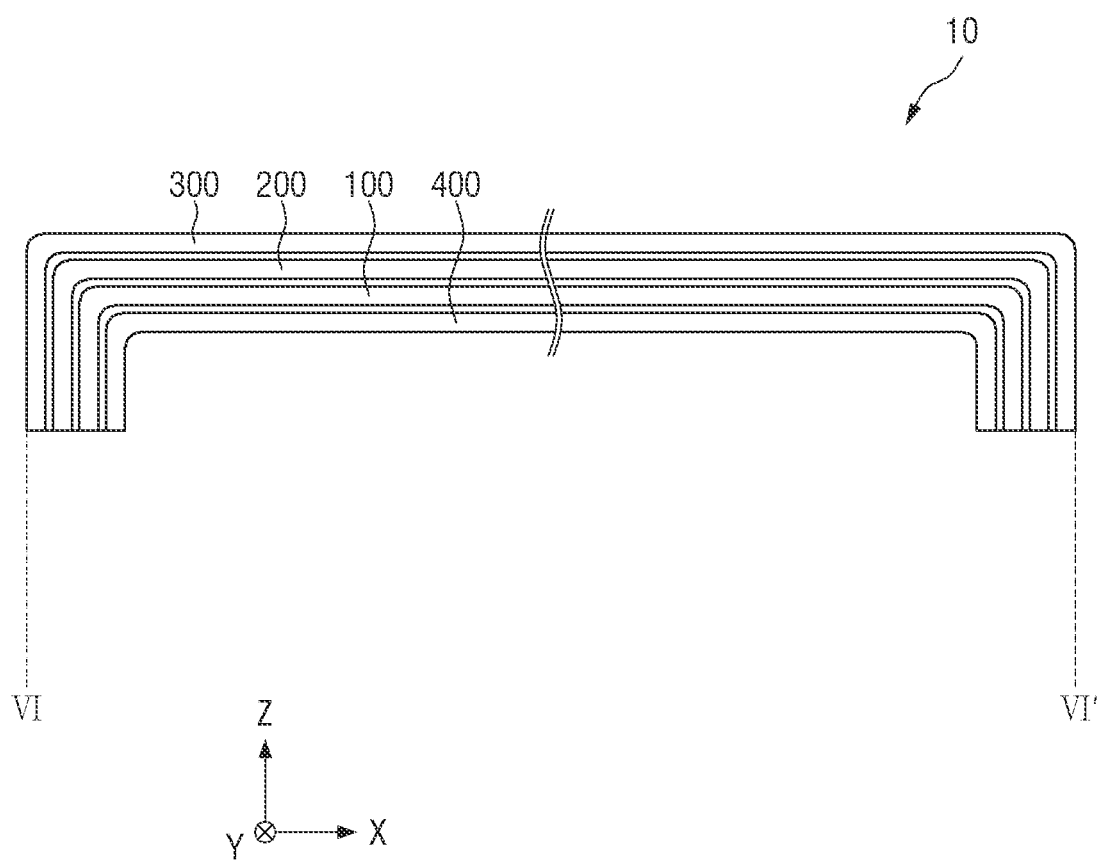
FIG. 17 is a cross-sectional view illustrating an example taken along line VI-VI' of FIG. 16.
Figure 18:
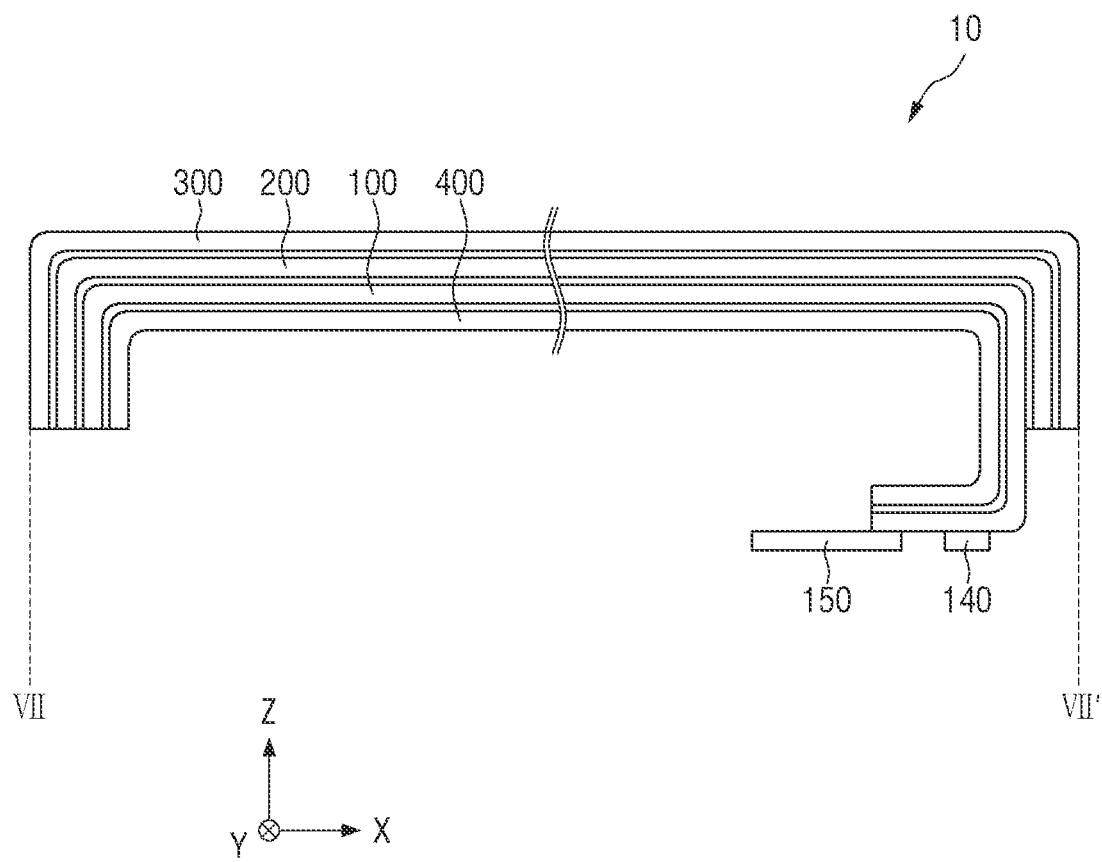
FIG. 18 is a cross-sectional view illustrating an example taken along line VII-VII' of FIG. 16.

FIG. 16 is a perspective view illustrating a display device according to some embodiments. FIG. 17 is a cross-sectional view illustrating an example taken along line VI-VI' of FIG. 16. FIG. 18 is a cross-sectional view illustrating an example taken along line VII-VII' of FIG. 16.

Referring to FIGS. 16 to 18, a display device 10 according to some embodiments is a device that displays a moving image or a still image, and may be used as a display screen of each of various products such as a television, a laptop computer, a monitor, a billboard, and Internet of Things (IOT) as well as portable electronic devices such as a mobile phone, a smartphone, a tablet personal computer (PC), a smartwatch, a watch phone, a mobile communication terminal, an electronic organizer, an electronic book, a portable multimedia player (PMP), a navigation device, and an ultra mobile PC (UMPC).

The display device 10 may include a display panel 100, a touch sensing device 200, a cover window 300, and a panel lower member 400.

The cover window 300 may include a cover plane portion CPS, a first cover side surface portion CSS1, a second cover side surface portion CSS2, a third cover side surface portion CSS3, a fourth cover side surface portion CSS4, a first cover edge portion CES1, a second cover edge portion CES2, a third cover edge portion CES3, a fourth cover edge portion CES4, a first cover corner portion CCS1, a second cover corner portion CCS2, a third cover corner portion CCS3, and a fourth cover corner portion CCS4.

The cover plane portion CPS of the cover window 300 may correspond to the plane portion PS of the display panel 100, the first cover side surface portion CSS1 of the cover window 300 may correspond to the first side surface portion SS1 of the display panel 100, and the second cover side surface portion CSS2 of the cover window 300 may correspond to the second side surface portion SS2 of the display panel 100. The third cover side surface portion CSS3 of the cover window 300 may correspond to the third side surface portion SS3 of the display panel 100, and the fourth cover side surface portion CSS4 of the cover window 300 may correspond to the fourth side surface portion SS4 of the display panel 100. The first edge side surface portion CES1 of the cover window 300 may correspond to the first edge portion ES1 of the display panel 100, and the second edge side surface portion CES2 of the cover window 300 may correspond to the second edge portion ES2 of the display panel 100. The third edge side surface portion CES3 of the cover window 300 may correspond to the third edge portion ES3 of the display panel 100, and the fourth edge side surface portion CES4 of the cover window 300 may correspond to the fourth edge portion ES4 of the display panel 100. The first cover corner portion CCS1 of the cover window 300 may correspond to the first corner portion CS1 of the display panel 100, and the second edge side surface portion CCS2 of the cover window 300 may correspond to the second corner portion CS2 of the display panel 100. The third cover corner portion CCS3 of the cover window 300 may correspond to the third corner portion CS3 of the display panel 100, and the fourth cover corner portion CCS3 of the cover window 300 may correspond to the fourth corner portion CS4 of the display panel 100.

Because the first cover corner portion CCS1 of the cover window 300 should cover the first corner portion CS1 and the first dead space DS1 of the display panel 100, a width of the first cover corner CCS1 of the cover window 300 may be equal to or greater than the sum of the width of the first corner portion CS1 and the width of the first dead space DS1 of the display panel 100 illustrated in FIG. 2b.

Because the second cover corner portion CCS2 of the cover window 300 should cover the second corner portion CS2 and the second dead space DS2 of the display panel 100, a width of the second cover corner CCS2 of the cover window 300 may be equal to or greater than the sum of the width of the second corner portion CS2 and the width of the second dead space DS2 of the display panel 100 illustrated in FIG. 2b.

Because the third cover corner portion CCS3 of the cover window 300 should cover the third corner portion CS3 and the third dead space DS3 of the display panel 100, a width of the third cover corner CCS3 of the cover window 300 may be equal to or greater than the sum of the width of the third corner portion CS3 and the width of the third dead space DS3 of the display panel 100 illustrated in FIG. 2b.

Because the fourth cover corner portion CCS4 of the cover window 300 should cover the fourth corner portion CS4 and the fourth dead space DS4 of the display panel 100, a width of the fourth cover corner CCS4 of the cover window 300 may be equal to or greater than the sum of the width of the fourth corner portion CS4 and the width of the fourth dead space DS4 of the display panel 100 illustrated in FIG. 2b.

The cover window 300 may serve to protect upper portions of the planar portion PS, the edge portions ES1, ES2, ES3, and ES4, and the side surface portions SS1, SS2, SS3, and SS4 of the display panel 100. The cover window 300 may be made of glass, sapphire, and/or plastic. The cover window 300 may be formed to be rigid or flexible. The cover window 300 may include light blocking portions formed in areas corresponding to the first to fourth dead spaces DS1, DS2, DS3, and DS4. The light blocking portions may include an opaque material such as a black dye.

The cover window 300 may be attached to the touch sensing device 200 through an adhesive member. The adhesive member may be an optically cleared adhesive film (OCA) or an optically cleared resin (OCR).

The touch sensing device 200 may be disposed between the cover window 300 and the display panel 100. The touch sensing device 200 may be disposed on the planar portion PS, the edge portions ES1, ES2, ES3, and ES4, and the side surface portions SS1, SS2, SS3, and SS4 of the display panel 100. Therefore, the touch sensing device 200 may sense a user's touch on the planar portion PS, the edge portions ES1, ES2, ES3, and ES4, and the side surface portions SS1, SS2, SS3, and SS4 of the display device 10.

The touch sensing device 200 may sense the user's touch as a capacitive type such as a self-capacitance type or a mutual capacitance type. When the touch sensing device 200 is implemented as the self-capacitance type, the touch sensing device 200 may include only touch driving electrodes, whereas when the touch sensing device 200 is implemented as the mutual capacitance type, the touch sensing device 200 may include touch driving electrodes and touch sensing electrodes.

The touch sensing device 200 may include a separate substrate and touch driving electrodes disposed on the separate substrate. In this case, the touch sensing device 200 may be attached to a thin film encapsulation film of the display panel 100 through an adhesive member. The adhesive member may be an optically cleared adhesive film (OCA) or an optically cleared resin (OCR). Alternatively, the touch sensing device 200 may be integrally formed with the display panel 100. In this case, the touch driving electrodes and the touch sensing electrodes of the touch sensing device 200 may be formed on the thin film encapsulation film of the display panel 100.

A polarizing film for reducing (e.g., preventing) deterioration of visibility due to reflection of external light may be added between the cover window 300 and the touch sensing device 200. In this case, the touch sensing device 200 may be attached to a lower surface of the polarizing film, and the polarizing film may be attached to a lower surface of the cover window 300 through an adhesive member.

The bending portion BS may be disposed on one side of the second side surface portion SS2 of the display panel 100, and the pad portion PAS may be disposed on one side of the bending portion BS. Because the bending portion BS is bent at a curvature (e.g., predetermined curvature), the pad portion PAS may be disposed below the planar portion PS as illustrated in FIG. 18. That is, the pad portion PAS may overlap the planar portion PS in the third direction (Z-axis direction).

The integrated driving circuit 140 may be disposed in the pad portion PAS. The integrated driving circuit 140 may be disposed on the substrate 110 in a chip on glass (COG) manner, a chip on plastic (COP) manner, or an ultrasonic bonding manner. Alternatively, the integrated driving circuit 140 may be disposed on the circuit board 150 in a chip on plastic (COP) manner.

The circuit board 150 may be attached to one side of the pad portion PAS. The circuit board 150 may be attached onto the pads of the pad portion PAS using an anisotropic conductive film. The circuit board 150 may be a flexible film such as a flexible printed circuit board, a printed circuit board, or a chip on film.

The panel lower member 400 may be disposed below the display panel 100 as illustrated in FIG. 6. The panel lower member 400 may be attached to a lower surface of the display panel 100 through an adhesive member. The adhesive member may be a pressure sensitive adhesive (PSA).

The panel lower member 400 may include at least one of a light absorbing member for absorbing external incident light, a buffer member for absorbing an external shock, a heat dissipation member for efficiently dissipating heat of the display panel 100, and a light blocking layer for blocking external incident light.

The light absorbing member may be disposed below the display panel 100. The light absorbing member blocks transmission of light to reduce (e.g., prevent) components disposed below the light absorbing member from being visible from above the display panel 100. The light absorbing member may include a light absorbing material such as a black pigment or dye.

The buffer member may be disposed below the light absorbing member. The buffer member absorbs the external shock to reduce (e.g., prevent) damage to the display panel 100. The buffer member may be formed as a single layer or a plurality of layers. For example, the buffer member may be formed of a polymer resin such as polyurethane, polycarbonate, polypropylene, or polyethylene or may include a material having elasticity, such as a sponge formed by foaming rubber, a urethane-based material, or an acrylic-based material.

The heat dissipation member may be disposed below the buffer member. The heat dissipation member may include a first heat dissipation layer including graphite or carbon nanotubes, and a second heat dissipation layer formed as a thin metal film such as copper, nickel, ferrite, or silver that may shield electromagnetic waves and has excellent thermal conductivity.

The embodiments of the present disclosure have been described hereinabove with reference to the accompanying drawings, but it will be understood by one of ordinary skill in the art to which the present disclosure pertains that various modifications and alterations may be made without departing from the technical spirit or essential feature of the present disclosure. Therefore, it is to be understood that the embodiments described above are illustrative rather than being restrictive in all aspects.

The invention claimed is:

1. A display panel comprising:
   a substrate including a planar portion, a first edge portion extending from one side of the planar portion, a second edge portion extending from an other side of the planar portion, a first side surface portion extending from one side of the first edge portion, and a first corner portion disposed between the first edge portion and the second edge portion;
   first data lines disposed in a display area of the planar portion;
   second data lines disposed in a display area of the first side surface portion;
   first fan-out lines disposed in a non-display area of the planar portion and connected to the first data lines;
   second fan-out lines disposed in the first corner portion and connected to the second data lines;
   a first power line between the first fan-out lines and the second fan-out lines at the first corner portion, the first power line having a curved portion in the first corner portion; and
   light emitting elements disposed at the first data lines and the second data lines in the display area of the planar portion and the display area of the first side surface portion, and respectively comprising a first electrode, a light emitting layer, and a second electrode; and
   an encapsulation film covering the light emitting elements and comprising at least one inorganic film and at least one organic film,
   wherein the at least one inorganic film and the at least one organic film cover the first data lines, the second data lines, and the first fan-out lines.

2. The display panel of claim 1, wherein the second fan-out lines are not covered by the at least one inorganic film.

3. The display panel of claim 1, wherein the at least one inorganic film and the at least one organic film do not cover the second fan-out lines.

4. The display panel of claim 1, wherein the at least one inorganic film and the at least one organic film cover the first power line.

5. The display panel of claim 1, wherein the second fan-out lines are disposed in a non-display area of the first side surface portion.

6. The display panel of claim 1, further comprising:
   scan lines disposed in the display area of the planar portion and crossing the first data lines; and
   a scan driver disposed outside the second fan-out lines in the first corner portion and comprising stages connected to the scan lines.

7. The display panel of claim 6, wherein the stages are not covered by the at least one inorganic film.

8. The display panel of claim 6, further comprising an organic film pattern disposed between adjacent stages of the stages.

9. The display panel of claim 8, further comprising scan control lines connected to the stages and crossing the organic film pattern.

10. The display panel of claim 9, wherein at least one of the scan control lines is disposed on a different layer from the first data lines and the second data lines.

11. The display panel of claim 1, wherein at least one of the first fan-out lines and at least one of the second fan-out lines are disposed on a same layer as the first data lines and the second data lines.

12. The display panel of claim 1, wherein at least one of the first fan-out lines and at least one of the second fan-out lines are disposed on a different layer from other layers of the first data lines and the second data lines.

* * * * *